US010823810B2

(12) United States Patent
He et al.

(10) Patent No.: US 10,823,810 B2
(45) Date of Patent: Nov. 3, 2020

(54) PHASE DEVIATION ACQUISITION METHOD AND SYSTEM, AND PHASE CALIBRATION METHOD AND SYSTEM

(71) Applicant: Siemens Healthcare GmbH, Erlangen (DE)

(72) Inventors: Jin Qiang He, Shenzhen (CN); Bin Kuang, Shenzhen (CN); Jing Zhao, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 178 days.

(21) Appl. No.: 16/145,969

(22) Filed: Sep. 28, 2018

(65) Prior Publication Data
US 2019/0101610 A1 Apr. 4, 2019

(30) Foreign Application Priority Data
Sep. 29, 2017 (CN) .......................... 2017 1 0907078

(51) Int. Cl.
*G01R 33/58* (2006.01)
*G01R 33/36* (2006.01)
*G01R 33/565* (2006.01)

(52) U.S. Cl.
CPC ....... *G01R 33/583* (2013.01); *G01R 33/3664* (2013.01); *G01R 33/5659* (2013.01)

(58) Field of Classification Search
CPC ............ G01R 33/3415; G01R 33/3607; G01R 33/543; G01R 33/5612; G01R 33/5659; G01R 33/583
See application file for complete search history.

(56) References Cited

U.S. PATENT DOCUMENTS 9,689,951 B2  6/2017 Greiser et al.
2007/0007960 A1* 1/2007 King ................ G01R 33/56518
324/309

(Continued)

FOREIGN PATENT DOCUMENTS

CN     102415882 A    4/2012
CN     102495383 A    6/2012
(Continued)

OTHER PUBLICATIONS

Y. Kato et al."Influences ofMeat Organization on Intensity Distribution in Magnetic Resonance Images" 6th International Special Topic Conference on ITAB, 2007.
(Continued)

*Primary Examiner* — Tung X Nguyen
(74) *Attorney, Agent, or Firm* — Schiff Hardin LLP

(57) ABSTRACT

A digital mode matrix phase calibration includes acquiring an actual phase deviation $\theta'_{mn}$ forming an actual phase deviation matrix $\theta'$ of a factory system; calculating an ideal phase deviation forming an ideal phase deviation matrix; calculating a phase deviation of the actual phase deviation and the ideal phase deviation; acquiring a maximum value of the phase deviation; when the maximum value $\Delta\theta_{max}$ is less than a preset threshold $\delta$, calculating a field system phase deviation $\theta''_{mn}$, and a field system phase deviation matrix $\theta''$ formed by the field system phase deviation $\theta''_{mn}$ subjecting a field system to phase calibration. By acquiring only one row and one column in the phase deviation matrix, the technical solution in embodiments of the present invention can fit phase deviations of other rows and columns, and the method subjects the system to phase calibration quickly.

25 Claims, 5 Drawing Sheets

(56) References Cited

U.S. PATENT DOCUMENTS

| | | | |
|---|---|---|---|
| 2010/0260397 A1* | 10/2010 | Block | ............... G01R 33/5614 382/131 |
| 2012/0074940 A1 | 3/2012 | Kimura | |
| 2013/0342200 A1* | 12/2013 | Ugurbil | ............. G01R 33/4835 324/307 |
| 2015/0091561 A1 | 4/2015 | Dai et al. | |
| 2016/0146913 A1 | 5/2016 | Renz et al. | |
| 2018/0098712 A1 | 4/2018 | Chen et al. | |

FOREIGN PATENT DOCUMENTS

| | | | |
|---|---|---|---|
| CN | 102749600 | A | 10/2012 |
| CN | 104515961 | A | 4/2015 |
| CN | 105738847 | A | 7/2016 |
| CN | 105844626 | A | 8/2016 |
| CN | 106353706 | A | 1/2017 |
| CN | 106814339 | A | 6/2017 |
| DE | 102014223878 | A1 | 5/2016 |

OTHER PUBLICATIONS

Xiaodan Zhao et al. "Computer-based Assessment of Ventricular Mechanical Synchrony from Magnetic Resonance Imaging"2015 37th Annual International Conference of the IEEE Engineering in Medicine and Biology Society (EMBC), 2015.

Chinese Action dated Aug. 26, 2020, Application No. 201710907078.

\* cited by examiner

PHASE DEVIATION ACQUISITION METHOD AND SYSTEM, AND PHASE CALIBRATION METHOD AND SYSTEM

BACKGROUND OF THE INVENTION

Field of the Invention

The present invention relates to a phase calibration method, in particular a magnetic resonance (MR) signal spatial phase calibration method.

Description of the Prior Art

Digital mode matrices are already widely used in the new generation of magnetic resonance systems. Compared with conventional hardware mode matrix technology, this new digital mode matrix technology does not require any change in coil hardware design. A digital mode matrix realizes the same signal conversion as a hardware mode on software; however, since the phase delay from magnetic resonance signal reception to completion of analog receiver sampling is different for each unit of a coil, it is necessary to calibrate the different delays.

An existing phase calibration method is based on taking measurements when a system is installed, but such a method is time-consuming. For example, when it is necessary to recalibrate phase data because a specific system component needs to be changed at a client site, the use of a factory calibration method to acquire phase calibration data causes the servicing time to be prolonged. For this reason, those skilled in the art are still endeavouring to find another phase calibration method for magnetic resonance systems.

SUMMARY OF THE INVENTION

In view of the above, the embodiments of the present invention not only provide a phase deviation acquisition method and system, but also provide a method and system for fast calibration of digital mode matrix phase using the phase deviation acquisition method, for the purpose of increasing the speed of phase calibration of a system located at a client site.

A phase deviation acquisition method proposed in an embodiment of the present invention comprises:

acquiring a row phase deviation $\{\partial_{jn}\}$ of a coil unit in a magnetic resonance (MR) system to any input channel j of a coil channel selector to an analog receiver via all output channels;

and acquiring a column phase deviation $\{\partial_{mi}\}$ of the coil unit to all input channels of the coil channel selector to the analog receiver via any output channel i;

obtaining, by means of the row phase deviation $\{\partial_{jn}\}$ and column phase deviation $\{\partial_{mi}\}$, a phase deviation $\partial_{mn}$ of the coil unit in the MR system to any input channel m of the coil channel selector to the analog receiver via any output channel n, to obtain any element value $\partial_{mn}$ in the phase deviation matrix $\partial$;

wherein i, j, m and n are each positive integers.

In an embodiment, the step of obtaining, by means of the row phase deviation $\{\partial_{jn}\}$ and column phase deviation $\{\partial_{mi}\}$, a phase deviation $\partial_{mn}$ of the coil unit in the MR system to any input channel m of the coil channel selector to the analog receiver via any output channel n, comprises:

taking the row phase deviation $\{\partial_{jn}\}$ and column phase deviation $\{\partial_{mi}\}$ as a row reference value and a column reference value of a phase deviation matrix $\partial$ respectively, obtaining any element value $\partial_{mn}$ in the phase deviation matrix $\partial$ by means of the phase deviation $\partial_{mn}$ of the following formula:

$$\partial_{mn} = \partial_{mi} + \partial_{jn} - \partial_{ji}$$

wherein $\partial_{jn}$ is a row element of the row phase deviation $\{\partial_{jn}\}$, $\partial_{mi}$ is a column element of the column phase deviation $\{\partial_{mi}\}$, and $\partial_{ji}$ is a row/column intersection element;

$\{\partial_{jn}\} = \{\partial_{j1}, \partial_{j2}, \ldots, \partial_{jN}\}$, (n=1, 2 ... N, 0<j<M);
$\{\partial_{mi}\} = \{\partial_{1i}, \partial_{2i}, \ldots, \partial_{Mi}\}$, (m=1, 2 ... M, 0<i<N);

m is a positive integer variable, n is a positive integer variable, M and N are the maximum numbers of rows and columns respectively in the phase deviation matrix $\partial$.

In an embodiment, the phase deviation matrix $\partial$ is:

$$\partial = \begin{bmatrix} \partial_{11} & \cdots & \partial_{1N} \\ \vdots & \ddots & \vdots \\ \partial_{M1} & \cdots & \partial_{MN} \end{bmatrix}$$

In an embodiment, a method of acquiring the row element $\partial_{jn}$ is as follows: measuring an input phase deviation $\varphi_j$ from the coil unit via a jth input channel of the coil channel selector in the MR system and measuring an output phase deviation $\omega_n$ from an nth output channel of the coil channel selector to the analog receiver in the MR system, the sum of these two terms being the row phase deviation $\partial_{jn}$:

$$\partial_{jn} = \varphi_j + \omega_n$$

a method of acquiring the column element $\partial_{mi}$ is as follows: measuring an input phase deviation $\varphi_m$ from the coil unit via an mth input channel of the coil channel selector in the MR system and measuring an output phase deviation $\omega_i$ from an ith output channel of the coil channel selector to the analog receiver in the MR system, the sum of these two terms being the column phase deviation $\partial_{mi}$:

$$\partial_{mi} = \varphi_m + \omega_i$$

In an embodiment, said any input channel j is a first input channel; said any output channel i is a first output channel;

wherein $\{\partial_{m1}\} = \{\partial_{11}, \partial_{21}, \ldots, \partial_{M1}\}$, $\{\partial_{1n}\} = \{\partial_{11}, \partial_{12}, \ldots, \partial_{1N}\}$;

the phase deviation $\partial_{mn}$ is $\partial_{mn} = \partial_{m1} + \partial_{1n} - \partial_{11}$.

In an embodiment, the method is also used for RF receiving link fault analysis.

A phase deviation acquisition system proposed in an embodiment of the present invention comprises:

a row phase deviation acquisition module, for acquiring a row phase deviation $\{\partial_{jn}\}$ of a coil unit in an MR system to any input channel j of a coil channel selector to an analog receiver via all output channels;

a column phase deviation acquisition module, for acquiring a column phase deviation $\{\partial_{mi}\}$ of the coil unit to all input channels of the coil channel selector to the analog receiver via any output channel i;

a calculation module, for calculating, by means of the row phase deviation $\{\partial_{jn}\}$ and column phase deviation $\{\partial_{mi}\}$, a phase deviation $\partial_{mn}$ of the coil unit in the MR system to any input channel m of the coil channel selector to the analog receiver via any output channel n, to acquire any element value $\partial_{mn}$ in the phase deviation matrix $\partial$;

wherein i, j, m and n are each positive integers.

In an embodiment, the row phase deviation acquisition module and/or the column phase deviation acquisition module further comprise(s):

a first measurement unit, for measuring an input phase deviation from the coil unit via any input channel of the coil channel selector in the MR system;

a second measurement unit, for measuring an output phase deviation from any output channel of the coil channel selector to the analog receiver in the MR system; and a summation unit, for calculating the sum of the input phase deviation and the output phase deviation, to obtain the row phase deviation $\{\partial_{jn}\}$ and/or the column phase deviation $\{\partial_{mi}\}$.

A digital mode matrix phase calibration method proposed in an embodiment of the present invention comprises:

acquiring an actual phase deviation $\theta'_{mn}$ forming an actual phase deviation matrix $\theta'$ of a factory system;

calculating an ideal phase deviation $\theta_{mn}$ forming an ideal phase deviation matrix $\theta$, by means of a row phase deviation $\{\theta_{jn}\}$ and a column phase deviation $\{\theta_{mi}\}$ of the actual phase deviation matrix $\theta'$;

calculating a phase deviation $\Delta\theta_{mn}$ of the actual phase deviation $\theta'_{mn}$ and the ideal phase deviation $\theta_{mn}$;

acquiring a maximum value $\Delta\theta_{max}$ of the phase deviation $\Delta\theta_{mn}$;

when the maximum value $\Delta\theta_{max}$ is less than a preset threshold $\delta$, using a row phase deviation $\{\theta''_{jn}\}$ and a column phase deviation $\{\theta''_{mi}\}$ of a field system to calculate a field system phase deviation $\theta''_{mn}$; and a field system phase deviation matrix $\theta''$ formed by the field system phase deviation $\theta''_{mn}$ subjecting the field system to phase calibration.

In an embodiment, the method further comprises:

when the maximum value $\Delta\theta_{max}$ is not less than the preset threshold $\delta$, using a method of acquiring the actual phase deviation $\theta_{mn}$ to acquire the field system phase deviation $\theta''_{mn}$.

In an embodiment, the actual phase deviation $\theta''_{mn}$ is as follows:

an input phase deviation $\varphi'_m$ from the coil unit via an input channel of the coil channel selector and an output phase deviation $\omega'_n$ from an output channel of the coil channel selector to the analog receiver in the factory system are measured, and the input phase deviation $\varphi'_m$ and the output phase deviation $\omega'_n$ are added, to give the actual phase deviation $\theta'_{mn}$ of the factory system:

$$\theta'_{mn}=\varphi'_m+\omega'_n$$

wherein $\theta'_{mn}$ is the actual phase deviation of the factory system, $\varphi'_m$ is the input phase deviation, and $\omega'_n$ is the output phase deviation.

In an embodiment, the actual phase deviation matrix $\theta'$ is:

$$\theta' = \begin{bmatrix} \varphi'_1+\omega'_1 & \cdots & \varphi'_2+\omega'_N \\ \vdots & \ddots & \vdots \\ \varphi'_M+\omega'_1 & \cdots & \varphi'_M+\omega'_N \end{bmatrix} = \begin{bmatrix} \theta'_{11} & \cdots & \theta'_{1N} \\ \vdots & \ddots & \vdots \\ \theta'_{M1} & \cdots & \theta'_{MN} \end{bmatrix}$$

wherein $\varphi'_M$ is the input phase deviation from the coil unit via an Mth input channel of the coil channel selector in an MR system; $\omega'_N$ is the output phase deviation from an Nth output channel of the coil channel selector to the analog receiver in the MR system, M is the maximum value of the number of rows in the matrix, and N is the maximum value of the number of columns in the matrix;

the row phase deviation $\{\theta'_{jn}\}$ and column phase deviation $\{\theta'_{mi}\}$ of the actual phase deviation matrix $\theta'$ are, respectively:

$$\{\theta'_{jn}\}=\{\theta'_{j1},\theta'_{j2},\ldots,\theta'_{jN}\}=\{\varphi'_j+\omega'_1,\varphi'_j+\omega'_2,\ldots,\varphi'_j+\omega'_N\};$$

$$\{\theta'_{mi}\}=\{\theta'_{1i},\theta'_{2i},\ldots,\theta'_{Mi}\}=\{\varphi'_1+\omega'_i,\varphi'_2+\omega'_i,\ldots,\varphi'_M+\omega'_i\}$$

$\theta'_{jn}$ is a row element of the row phase deviation $\{\theta'_{jn}\}$, $\theta'_{mi}$ is a column element of the column phase deviation $\{\theta'_{mi}\}$.

In an embodiment, the ideal phase deviation $\theta_{mn}$ is as follows:

taking the row phase deviation $\{\theta'_{jn}\}$ and the column phase deviation $\{\theta'_{mi}\}$ of the actual phase deviation $\theta'_{mn}$ as a row reference value $\{\theta_{jn}\}(0<j\leq M)$ and a column reference value $\{\theta_{mi}\}(0<i\leq N)$ of the ideal phase deviation matrix $\theta$ respectively, the ideal phase deviation $\theta_{mn}$ is obtained by the following formula, to obtain any element value $\theta_{mn}$ in the ideal phase deviation matrix $\theta$:

$$\theta_{mn}=\theta_{mi}+\theta_{jn}-\theta_{ji}$$

wherein $\{\theta_{jn}\}=\{\theta'_{jn}\}$; $\{\theta_{mi}\}=\{\theta'_{mi}\}$;
$\{\theta_{jn}\}=\{\theta_{j1},\theta_{j2},\ldots,\theta_{jN}\}$, (n=1, 2 ... N, 0<j<M);
$\{\theta_{mi}\}=\{\theta_{1i},\theta_{2i},\ldots,\theta_{Mi}\}$, (m=1, 2 ... M, 0<i<N);

wherein $\theta_{jn}$ is a row element of the row reference value $\{\theta_{jn}\}$, $\theta_{mi}$ is a column element of the column reference value $\{\theta_{mi}\}$, $\theta_{ji}$ is a row/column intersection element; $\theta_{mi}$ represents an element value in the ith column and the mth row, $\theta_{jn}$ represents an element value in the nth column and the jth row, $\theta_{ji}$ represents an element value in the jth row and the ith column, M is the maximum value of the number of rows in the matrix, N is the maximum value of the number of columns in the matrix, $1\leq m\leq M$, $1\leq n\leq N$.

In an embodiment, the row phase deviation $\{\theta'_{jn}\}$ is a first row phase deviation $\{\theta'_{1n}\}$ of the actual phase deviation matrix $\theta$, i.e. said any input channel j is chosen to be a first input channel; the column phase deviation $\{\theta'_{mi}\}$ is a first column phase deviation $\{\theta'_{m1}\}$ of the actual phase deviation matrix $\theta$, i.e. said any output channel i is chosen to be a first output channel;

wherein the first row phase deviation $\{\theta'_{1n}\}$ and first column phase deviation $\{\theta'_{m1}\}$ are the row reference value $\{\theta_{1n}\}$ and column reference value $\{\theta_{m1}\}$ of the ideal phase deviation matrix $\theta$ respectively, and the ideal phase deviation $\theta_{mn}$ is:

$$\theta_{mn}=\theta_{m1}+\theta_{1n}-\theta_{11}$$

In an embodiment, the phase deviation $\Delta\theta_{mn}$ is:

$$\Delta\theta_{mn}=\theta'_{mn}-(\theta_{m1}+\theta_{1n}-\theta_{11})$$

In an embodiment, when the maximum value $\Delta\theta_{max}$ is less than the preset threshold $\delta$, the calculation of the field system phase deviation $\theta''_{mn}$ is as follows:

measuring a row phase deviation $\{\theta''_{jn}\}$ and a column phase deviation $\{\theta''_{mi}\}$ of the field system;

obtaining the field system phase deviation $\theta''_{mn}$ by the following formula:

$$\theta''_{mn}=\theta''_{mi}+\theta''_{jn}-\theta''_{ji};$$

wherein $\theta''_{mi}$ represents an element value in the ith column and the mth row, $\theta''_{jn}$ represents an element value in the nth column and the jth row, $\theta''_{ji}$ represents an element value in the jth row and the ith column, M is the maximum value of the number of rows in the matrix, N is the maximum value of the number of columns in the matrix, $1\leq m\leq M$, $1\leq n\leq N$.

In an embodiment, the field system phase deviation matrix $\theta''$ formed by the field system phase deviation $\theta''_{mn}$ is:

$$\theta'' = \begin{bmatrix} \theta''_{11} & \cdots & \theta''_{1N} \\ \vdots & \ddots & \vdots \\ \theta''_{M1} & \cdots & \theta''_{MN} \end{bmatrix}$$

wherein M is the maximum value of the number of rows in the matrix, N is the maximum value of the number of columns in the matrix, 1≤m≤M, 1≤n≤N.

In an embodiment, using a method of acquiring the actual phase deviation $\theta'_{mn}$ to acquire the field system phase deviation $\theta''_{mn}$ is as follows:

measuring an input phase deviation $\varphi''_m$ from a coil unit via an input channel of a coil channel selector and an output phase deviation $\omega''_n$ from an output channel of the coil channel selector to an analog receiver in the field system, i.e.:

$$\theta''_{mn} = \varphi''_m + \omega''_n$$

wherein $\theta''_{mn}$ is the actual phase deviation of the field system, $\varphi''_m$ is the input phase deviation, and $\omega''_n$ is the output phase deviation.

In an embodiment, the field system phase deviation matrix $\theta''$ is:

$$\theta'' = \begin{bmatrix} \varphi''_1 + \omega''_1 & \cdots & \varphi''_2 + \omega''_N \\ \vdots & \ddots & \vdots \\ \varphi''_M + \omega''_1 & \cdots & \varphi''_M + \omega''_N \end{bmatrix} = \begin{bmatrix} \theta''_{11} & \cdots & \theta''_{1N} \\ \vdots & \ddots & \vdots \\ \theta''_{M1} & \cdots & \theta''_{MN} \end{bmatrix}$$

wherein $\varphi''_M$ is the input phase deviation from the coil unit via an Mth input channel of the coil channel selector in the field system; $\omega''_N$ is the output phase deviation from an Nth output channel of the coil channel selector to the analog receiver in the MR system, M is the maximum value of the number of rows in the matrix, and N is the maximum value of the number of columns in the matrix.

A digital mode matrix phase calibration system proposed in an embodiment of the present invention comprises:

an actual phase deviation acquisition module, for acquiring an actual phase deviation $\theta'_{mn}$ of a factory system forming an actual phase deviation matrix $\theta'$ of the factory system;

an ideal phase deviation calculation module, for calculating an ideal phase deviation $\theta_{mn}$ forming an ideal phase deviation matrix $\theta$;

a phase deviation calculation module, for calculating a phase deviation $\Delta\theta_{mn}$ of the actual phase deviation $\theta'_{mn}$ and the ideal phase deviation $\theta_{mn}$:

$$\Delta\theta_{mn} = \theta'_{mn} - \theta_{mn};$$

a maximum value acquisition module, for acquiring a maximum value $\Delta\theta_{max}$ of the phase deviation $\Delta\theta_{mn}$;

a determining module, for determining whether the maximum value $\Delta\theta_{max}$ is less than a preset threshold $\delta$; and a field system phase deviation module, for calculating the field system phase deviation $\theta''_{mn}$ using the field system phase deviation module when the maximum value $\Delta\theta_{max}$ is less than the preset threshold $\delta$, with a field system phase deviation matrix $\theta''$ formed by the field system phase deviation $\theta''_{mn}$ subjecting a field system to phase calibration, wherein m and n are each positive integer variables.

In an embodiment, the actual phase deviation acquisition module comprises:

a first measurement unit, for measuring an input phase deviation $\varphi'_m$ from a coil unit via any input channel of a coil channel selector in the factory system;

a second measurement unit, for measuring an output phase deviation $\omega'_n$ from any output channel of the coil channel selector to an analog receiver in the factory system; and a summation unit, for calculating the actual phase deviation $\theta'_{mn}$, i.e. the sum of the input phase deviation $\varphi'_m$ and the output phase deviation $\omega'_n$:

$$\theta'_{mn} = \varphi'_m + \omega'_n.$$

In an embodiment, the actual phase deviation matrix $\theta'$ formed by the actual phase deviation $\theta'_{mn}$ is:

$$\theta' = \begin{bmatrix} \varphi'_1 + \omega'_1 & \cdots & \varphi'_2 + \omega'_N \\ \vdots & \ddots & \vdots \\ \varphi'_M + \omega'_1 & \cdots & \varphi'_M + \omega'_N \end{bmatrix} = \begin{bmatrix} \theta'_{11} & \cdots & \theta'_{1N} \\ \vdots & \ddots & \vdots \\ \theta'_{M1} & \cdots & \theta'_{MN} \end{bmatrix}$$

wherein $\varphi'_M$ is the input phase deviation from the coil unit via an Mth input channel of the coil channel selector in an MR system; $\omega'_N$ is the output phase deviation from an Nth output channel of the coil channel selector to the analog receiver in the MR system, M is the maximum value of the number of rows in the matrix, and N is the maximum value of the number of columns in the matrix;

the row phase deviation $\{\theta'_{jn}\}$ and column phase deviation $\{\theta'_{mi}\}$ of the actual phase deviation matrix $\theta'$ are, respectively:

$$\{\theta'_{jn}\} = \{\theta'_{j1}, \theta'_{j2}, \ldots, \theta'_{jN}\} = \{\varphi'_j + \omega'_1, \varphi'_j + \omega'_2, \ldots, \varphi'_j + \omega'_N\};$$

$$\{\theta'_{mi}\} = \{\theta'_{1i}, \theta'_{2i}, \ldots, \theta'_{Mi}\} = \{\varphi'_1 + \omega'_i, \varphi'_2 + \omega'_i, \ldots, \varphi'_M + \omega'_i\}$$

$\theta'_{jn}$ is a row element of the row phase deviation $\{\theta'_{jn}\}$, $\theta'_{mi}$ is a column element of the column phase deviation $\{\theta'_{mi}\}$.

In an embodiment, the ideal phase deviation calculation module can be configured to:

obtain the ideal phase deviation $\theta_{mn}$ by the following formula, taking the row phase deviation $\{\theta'_{jn}\}$ and the column phase deviation $\{\theta'_{mi}\}$ of the actual phase deviation $\theta'_{mn}$ as a row reference value $\{\theta_{jn}\}$ (0<j≤M) and a column reference value $\{\theta_{mi}\}$ (0<i≤N) of the ideal phase deviation matrix $\theta$ respectively, to obtain any element value $\theta_{mn}$ in the ideal phase deviation matrix $\theta$;

$$\theta_{mn} = \theta_{mi} + \theta_{jn} - \theta_{ji}$$

wherein $\{\theta_{jn}\} = \{\theta'_{jn}\}$; $\{\theta_{mi}\} = \{\theta'_{mi}\}$;
$\{\theta_{jn}\} = \{\theta_{j1}, \theta_{j2}, \ldots, \theta_{jN}\}$, (n=1, 2 . . . N, 0<j<M);
$\{\theta_{mi}\} = \{\theta_{1i}, \theta_{2i}, \ldots, \theta_{Mi}\}$, (m=1, 2 . . . M, 0<i<N);

wherein $\theta_{jn}$ is a row element of the row reference value $\{\theta_{jn}\}$, $\theta_{mi}$ is a column element of the column reference value $\{\theta_{mi}\}$, and $\theta_{ji}$ is a row/column intersection element; M is the maximum value of the number of rows in the matrix, N is the maximum value of the number of columns in the matrix, 1≤m≤M, 1≤n≤N.

In an embodiment, the field system phase deviation calculation module:

is used for measuring a row phase deviation $\{\theta''_{jn}\}$ and a column phase deviation $\{\theta''_{mi}\}$ of the field system when the determining module determines that the maximum value $\Delta\theta_{max}$ is less than the preset threshold $\delta$;

wherein the row phase deviation $\{\theta''_{jn}\}$ is a phase deviation of a coil unit in the field system to any input channel j of a coil channel selector to an analog receiver via all output channels;

the column phase deviation $\{\theta''_{mi}\}$ is a phase deviation of the coil unit in the field system to all input channels of the coil channel selector to the analog receiver via any output channel i;

obtaining the field system phase deviation $\theta''_{mn}$ by the following formula:

$$\theta''_{mn}=\theta''_{mi}+\theta''_{jn}-\theta''_{ji}$$

wherein $\theta''_{mi}$ represents an element value in the ith column and the mth row, $\theta''_{jn}$ represents an element value in the nth column and the jth row, $\theta''_{ji}$ represents an element value in the jth row and the ith column, M is the maximum value of the number of rows in the matrix, N is the maximum value of the number of columns in the matrix, $1 \leq m \leq M$, $1 \leq n \leq N$.

In an embodiment, the field system phase deviation module:

is also used for acquiring the field system phase deviation $\theta''_{mn}$ using a method by which the actual phase deviation module acquires the actual phase deviation $\theta'_{mn}$, when the maximum value $\Delta\theta_{max}$ is greater than the preset threshold $\delta$.

It can be seen from the above solution that the phase deviation acquisition method for an MR system proposed in the present invention can quickly calculate the phase deviation of the system. Moreover, an embodiment of the present invention applies the phase deviation acquisition method to fast calibration of phase in an MR system, and proposes a method for determining, on the basis of historical phase calibration data, whether a fast phase calibration method can be used, and can shorten the phase calibration time under the precondition that precision is ensured. In particular, when an engineer needs to reacquire phase deviation at a client site because hardware has been changed, the method can greatly reduce servicing time.

DESCRIPTION OF THE PREFERRED EMBODIMENTS

Figure 1:
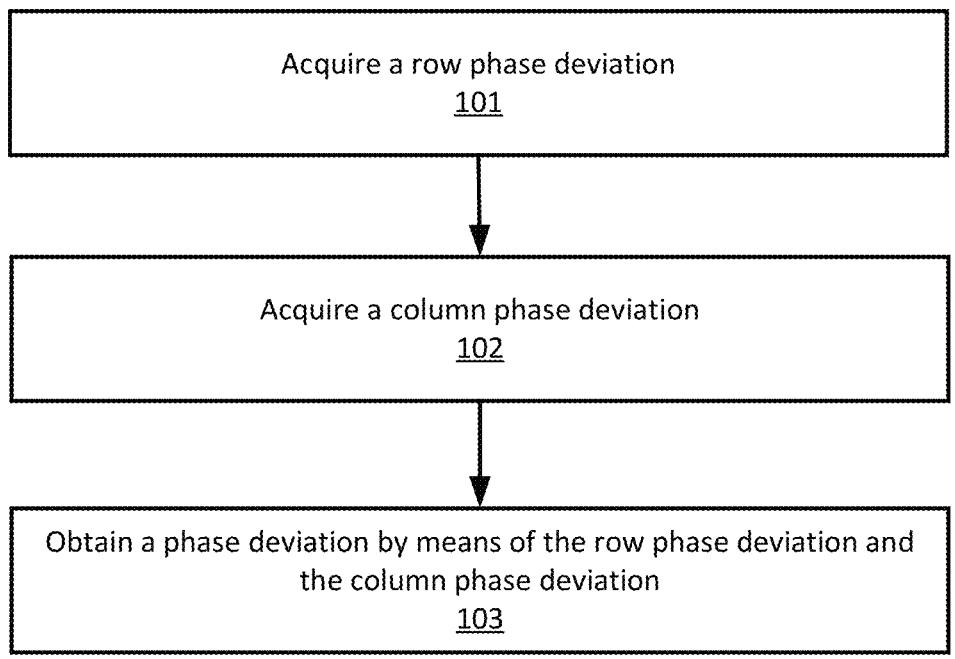
FIG. 1 is a demonstrative method flow chart of a phase deviation acquisition method in an embodiment of the present invention.
Figure 2:
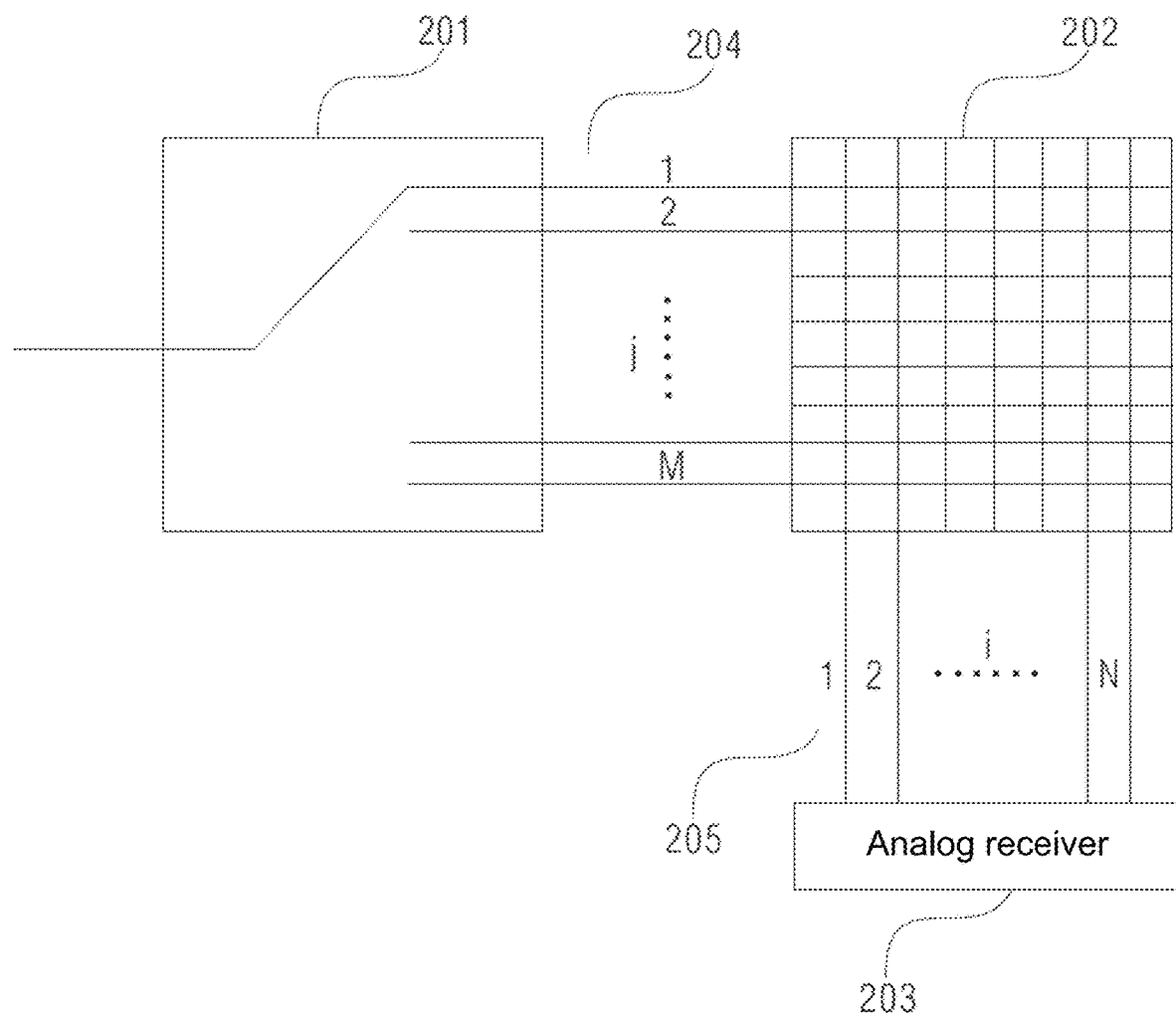
FIG. 2 is a simplified model diagram of measurement of phase deviation in a magnetic resonance system in an embodiment of the present invention.
Figure 3:
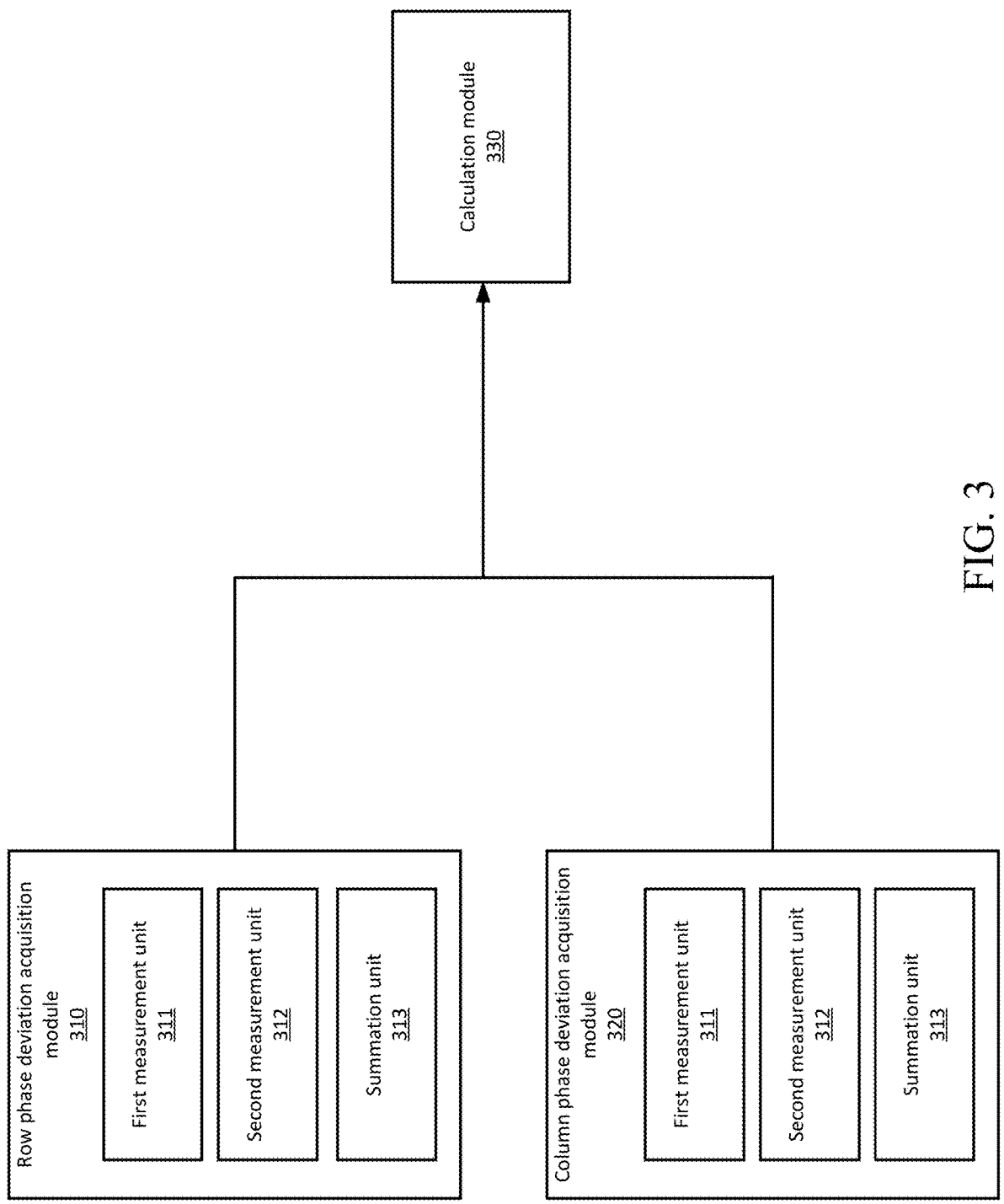
FIG. 3 is a demonstrative module structural diagram of a phase deviation acquisition system in an embodiment of the present invention.

FIG. 1 is a demonstrative method flow chart of a phase deviation acquisition method in an embodiment of the present invention. FIG. 2 is a simplified model diagram of measurement of phase deviation in a magnetic resonance system in an embodiment of the present invention. FIG. 3 is a demonstrative module structural diagram of a phase deviation acquisition system in an embodiment of the present invention. Referring to FIGS. 1 to 3, a phase deviation acquisition method of an embodiment of the present invention is explained in detail.

In an embodiment of the present invention, a simplified model of phase deviation in an MR system comprises a coil unit 201, a coil channel selector 202, an analog receiver 203, an input channel 204 for communication between the coil unit 201 and the coil channel selector 202, and an output channel 205 for communication between the coil channel selector 202 and the analog receiver 203.

The coil unit 201 is used for receiving a system signal; the signal is transmitted to the coil channel selector 202 via the input channel 204, then the signal is transmitted to the analog receiver 203 via the output channel 205, and the analog receiver 203 samples the signal.

According to the simplified model of phase deviation of an MR system described above, an embodiment of the present invention proposes a phase deviation acquisition method, comprising:

step 101: acquiring a row phase deviation $\{\partial_{jn}\}$ of a coil unit 201 in an MR system to any input channel j204 of a coil channel selector 202 to an analog receiver 203 via all output channels 205.

In particular implementation, the row phase deviation $\{\partial_{jn}\}$ may be calculated by more than one method; as an example, one of these is shown below.

In an embodiment of the present invention, the row phase deviation $\{\partial_{jn}\}$ is composed of a number of row elements, e.g. $\{\partial_{jn}\}=\{\partial_{j1}, \partial_{j2}, \ldots, \partial_{jN}\}$, (n=1, 2 ... N, 0<j<M), wherein a method of acquiring one row element $\partial_{jn}$ is as follows: measuring a phase deviation $\varphi_j$ from the coil unit 201 via a jth input channel 204 of the coil channel selector 202 in the MR system, and measuring a phase deviation $\omega_n$ from an nth output channel 205 of the coil channel selector 202 to the analog receiver 203 in the MR system; the sum of these two terms is then the row phase deviation $\partial_{jn}$:

$$\partial_{jn}=\varphi_j+\omega_n. \quad (1)$$

Step 102: acquiring a column phase deviation $\{\partial_{mi}\}$ of the coil unit 201 to all input channels 204 of the coil channel selector 202 to the analog receiver 203 via any output channel i205.

In particular implementation, the column phase deviation $\{\partial_{mi}\}$ may be calculated by more than one method; as an example, one of these is shown below.

In an embodiment of the present invention, the column phase deviation $\{\partial_{mi}\}$ is composed of a number of column elements, e.g. $\{\partial_{mi}\}=\{\partial_{1i}, \partial_{2i}, \ldots, \partial_{Mi}\}$, (m=1, 2 ... M, 0<i<N); wherein a method of acquiring one column element $\partial_{mi}$ is as follows: measuring a phase deviation $\varphi_m$ from the coil unit 201 via an mth input channel 204 of the coil channel selector 202 in the MR system, and measuring a phase deviation $\omega_i$ from an ith output channel 205 of the coil channel selector 202 to the analog receiver 203 in the MR system; the sum of these two terms is then the column phase deviation $\partial_{mi}$:

$$\partial_{mi}=\varphi_m+\omega_i. \quad (2)$$

Step 103: obtaining, by means of the row phase deviation $\{\partial_{jn}\}$ and column phase deviation $\{\partial_{mi}\}$, a phase deviation $\partial_{mn}$ of the coil unit 201 in the MR system to any input channel m204 of the coil channel selector 202 to the analog receiver 203 via any output channel n205, to obtain any element value $\partial_{mn}$ in the phase deviation matrix $\partial$.

In particular implementation, any element value $\partial_{mn}$ may be calculated by more than one method; as an example, one of these is shown below.

In an embodiment of the present invention, the step of obtaining, by means of the row phase deviation $\{\partial_{jn}\}$ and column phase deviation $\{\partial_{mi}\}$, a phase deviation $\partial_{mn}$ of the coil unit 201 in the MR system to any input channel m204 of the coil channel selector 202 to the analog receiver 203 via any output channel n205, comprises:

taking the row phase deviation $\{\partial_{jn}\}$ and column phase deviation $\{\partial_{mi}\}$ as a row reference value and a column reference value of a phase deviation matrix ∂ respectively, obtaining any element value $\partial_{mn}$: in the phase deviation matrix ∂ by means of the phase deviation $\partial_{mn}$ of the following formula:

$$\partial_{mn}=\partial_{mi}+\partial_{jn}-\partial_{ji} \quad (3)$$

wherein $\partial_{jn}$ is a row element of the row phase deviation $\{\partial_{jn}\}$, $\partial_{mi}$ is a column element of the column phase deviation $\{\partial_{mi}\}$, $\partial_{ji}$ is a row/column intersection element; m is a positive integer variable, n is a positive integer variable, M and N are the maximum numbers of rows and columns respectively in the phase deviation matrix ∂.

Acquiring the row phase deviation $\{\partial_{jn}\}$ is acquiring a first row phase deviation $\{_{1n}\}$ of the phase deviation matrix ∂, i.e. said any input channel j is chosen to be a first input channel; acquiring the column phase deviation $\{\partial_{mi}\}$ is acquiring a first column phase deviation $\{\partial_{m1}\}$ of the phase deviation matrix ∂, i.e. said any output channel i is chosen to be a first output channel:

wherein $\{\partial_{m1}\}=\{\partial_{11}, \partial_{21}, \ldots, \partial_{M1}\}$, $\{\partial_{1n}\}=\{\partial_{11}, \partial_{12}, \ldots, \partial_{1N}\}$;

the phase deviation $\partial_{mn}$ is $\partial_{mn}=\partial_{m1}+\partial_{1n}-\partial_{11}$.

In particular implementation, there may be more than one method for the phase deviation matrix ∂ formed by the phase deviation $\partial_{mn}$; as an example, one of these is shown below.

In an embodiment of the present invention, the phase deviation matrix ∂ formed by the phase deviation $\partial_{mn}$ is:

$$\partial = \begin{bmatrix} \partial_{11} & \cdots & \partial_{1N} \\ \vdots & \ddots & \vdots \\ \partial_{M1} & \cdots & \partial_{MN} \end{bmatrix} \quad (4)$$

According to an embodiment of the present invention, the method for acquiring phase deviation may also be used for RF receiving link fault analysis.

Another embodiment of the present invention proposes a phase deviation acquisition system, comprising a row phase deviation acquisition module 310, a column phase deviation acquisition module 320 and a calculation module 330.

The row phase deviation acquisition module 310 is used for acquiring a row phase deviation $\{\partial_{jn}\}$ of a coil unit 201 in an MR system to any input channel j204 of a coil channel selector 202 to an analog receiver 203 via all output channels 205.

The column phase deviation acquisition module 320 is used for acquiring a column phase deviation $\{\partial_{mi}\}$ of the coil unit 201 to all input channels 204 of the coil channel selector 202 to the analog receiver 203 via any output channel i205.

The calculation module 330 is used for calculating, by means of the row phase deviation $\{\partial_{jn}\}$ and column phase deviation $\{\partial_{mi}\}$, a phase deviation $\partial_{mn}$ of the coil unit 201 in the MR system to any input channel m204 of the coil channel selector 202 to the analog receiver 203 via any output channel n205, to obtain any element value $\partial_{mn}$ in the phase deviation matrix ∂.

The row phase deviation acquisition module 310 and/or the column phase deviation acquisition module 320 further comprise(s) a first measurement unit, a second measurement unit and a summation unit.

The first measurement unit is used for measuring an input phase deviation from the coil unit 201 via any input channel 204 of the coil channel selector 202 in the MR system.

The second measurement unit is used for measuring an output phase deviation from any output channel 205 of the coil channel selector 202 to the analog receiver 203 in the MR system.

The summation unit is used for calculating the sum of the input phase deviation and the output phase deviation, for the purpose of acquiring the row and/or column phase deviation.

Taking the row phase deviation acquisition module 310 as an example, the functions of a first measurement unit 311, a second measurement unit 312 and a summation unit 313 are explained. The row phase deviation $\{\partial_{jn}\}$ acquired by the row phase deviation acquisition module 310 comprises n row elements $\partial_{jn}$, wherein the first measurement unit 311 is used for measuring the input phase deviation $\varphi_j$ from the coil unit via the jth input channel of the coil channel selector in the MR system, the second measurement unit 312 is used for measuring the output phase deviation $\omega_n$ from the nth output channel of the coil channel selector to the analog receiver in the MR system, and the summation unit 313 is used for calculating the sum of these two terms, as shown in formula (1).

Since the phase values of the MR system all satisfy the laws presented in formulae (1) to (4), the phase acquisition method in an embodiment of the present invention may also be used for RF receiving link fault analysis. For example, in an actual system, an error might arise for various reasons, and if the disparity between the error and the ideal situation is too great, it is highly likely that a fault will occur. Thus, the present method may also be used for fault analysis, shortening the fault diagnosis time, and increasing the accuracy of the diagnosis result.

Figure 4:
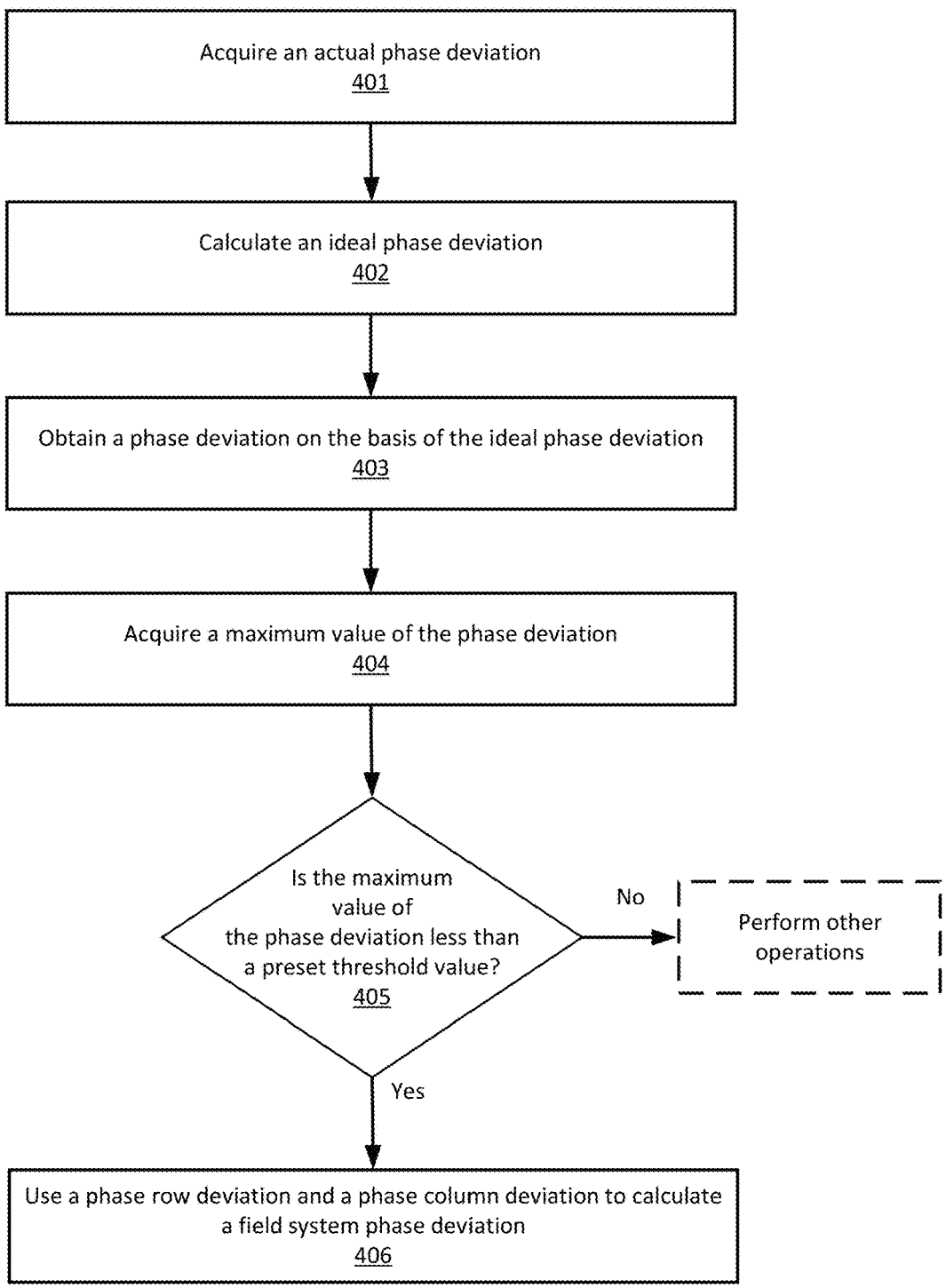
FIG. 4 is a demonstrative method flow chart of a digital mode matrix phase calibration method in an embodiment of the present invention.
Figure 5:
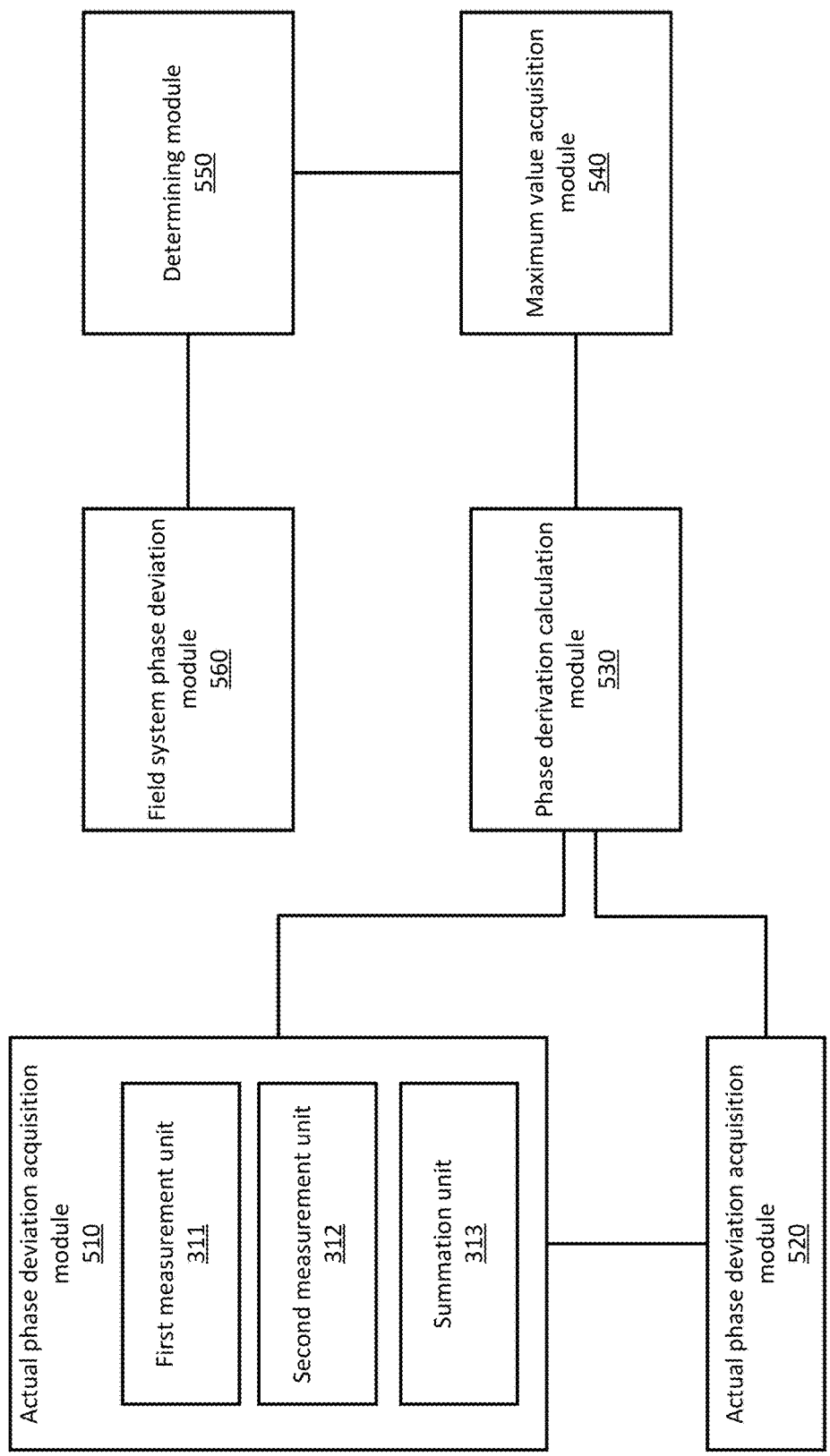
FIG. 5 is a demonstrative module structural diagram of a digital mode matrix phase calibration system in an embodiment of the present invention.

To shorten the time taken to re-measure system phase deviation, necessitated by the changing of a system component at a client site, another embodiment of the present invention proposes a method for fast phase calibration based on historical phase calibration data, i.e. a fast calibration method for digital mode matrix phase and a fast phase calibration system. Referring to FIGS. 2, 4 and 5, the fast calibration method for digital mode matrix phase comprises the following steps:

step 401: acquiring an actual phase deviation $\theta'_{mn}$ forming an actual phase deviation matrix $\theta'$ of a factory system.

In this embodiment, a method of measuring the actual phase deviation $\theta'_{mn}$ of the factory system may be as follows:

measuring an input phase deviation $\varphi'_m$ from a coil unit 201 via an input channel 204 of a coil channel selector 202 in a factory MR system, and measuring an output phase deviation $\omega'_n$ from an output channel 205 of the coil channel selector 202 to an analog receiver 203, adding the input phase deviation $\varphi'_m$ and the output phase deviation $\omega'_n$ to give the actual phase deviation $\theta'_{mn}$ of the factory system, i.e. formula (5) below:

$$\theta'_{mn}=\varphi'_m+\omega'_n \quad (5)$$

wherein $\theta'_{mn}$ is the actual phase deviation of the factory system, $\varphi'_m$ is the input phase deviation, and $\omega'_n$ is the output phase deviation.

The method shown in formula (5) of splitting the actual phase deviation $\theta'_{mn}$ into the input phase deviation and the output phase deviation facilitates measurement of the actual phase deviation $\theta'_{mn}$ and fast calculation of an ideal phase deviation $\theta_{nm}$.

The actual phase deviation matrix $\theta'$ formed by the actual phase deviation $\theta'_{mn}$ of the factory MR system may be as shown in formula (6) below:

$$\theta' = \begin{bmatrix} \theta'_{11} & \cdots & \theta'_{1N} \\ \vdots & \ddots & \vdots \\ \theta'_{M1} & \cdots & \theta'_{MN} \end{bmatrix} = \begin{bmatrix} \varphi'_1 + \omega'_1 & \cdots & \varphi'_2 + \omega'_N \\ \vdots & \ddots & \vdots \\ \varphi'_M + \omega'_1 & \cdots & \varphi'_M + \omega'_N \end{bmatrix} \quad (6)$$

wherein m is a positive integer, n is a positive integer, M is the maximum value of the number of rows in the matrix, N is the maximum value of the number of columns in the matrix, 1≤m≤M, 1≤n≤N, $\varphi'_M$ is the input phase deviation from a coil unit 201 via the Mth input channel 204 of a coil channel selector 202 in the MR system; $\omega'_N$ is the output phase deviation from the Nth output channel 205 of the coil channel selector 202 to an analog receiver 203 in the MR system.

It is clear from the above formulae that the row phase deviation $\{\theta'_{jn}\}$ and column phase deviation $\{\theta'_{mi}\}$ of the actual phase deviation matrix θ' are, respectively:

$$\{\theta'_{jn}\}=\{\theta'_{j1},\theta'_{j2},\ldots,\theta'_{jN}\}=\{\varphi'_j+\omega'_1,\varphi'_j+\omega'_2,\ldots,\varphi'_j+\omega'_N\};$$

$$\{\theta'_{mi}\}=\{\theta'_{1i},\theta'_{2i},\ldots,\theta'_{Mi}\}=\{\varphi'_1+\omega'_i,\varphi'_2+\omega'_i,\ldots,\varphi'_M+\omega'_i\}$$

$\theta'_{jn}$ is a row element of the row phase deviation $\{\theta'_{jn}\}$, $\theta'_{mi}$ is a column element of the column phase deviation $\{\theta'_{mi}\}$.

The method shown in formulae (5) and (6) of splitting the actual phase deviation $\theta'_{mn}$ into the input phase deviation and the output phase deviation facilitates measurement of the actual phase deviation $\theta'_{mn}$ and fast calculation of an ideal phase deviation $\theta_{mn}$.

In particular implementation, the actual phase deviation $\theta'_{mn}$ of the factory system, and the actual phase deviation matrix θ' of the factory system formed thereby, may be calculated by more than one method; for example, a deviation at each position is measured directly, or it is also necessary to measure a deviation arising at the coil channel selector 202 in order to make an acquired deviation value more accurate.

As shown in FIG. 2, taking as an example the case where a measurement method is used to acquire the actual phase deviation $\theta'_{mn}$ of the factory system, a process of acquiring the actual phase deviation $\theta'_{mn}$ of the factory system may comprise measuring the input phase deviation from the coil unit 201 to the input channel 204 of the coil channel selector 202 and measuring the output phase deviation from the output channel 205 of the coil channel selector 202 to the analog receiver 203, and adding the input phase deviation and the output phase deviation to give the actual phase deviation $\theta'_{mn}$ of the factory system. It has been verified by experiment that a phase deviation of the coil channel selector 202 itself can be ignored.

The simplified model diagram and mathematical model of the acquisition of the actual phase deviation $\theta'_{mn}$ of the factory system are likewise suitable for the acquisition of a field system phase deviation $\theta''_{mn}$ in step 406.

Step 402: calculating an ideal phase deviation $\theta_{mn}$ forming an ideal phase deviation matrix θ, by means of a row phase deviation $\{\theta_{jn}\}$ and a column phase deviation $\{\theta_{mi}\}$ of the actual phase deviation matrix θ'.

The row phase deviation $\{\theta_{jn}\}$ is a phase deviation of a coil unit in the factory system to any input channel j of a coil channel selector to an analog receiver via all output channels; the column phase deviation $\{\theta_{mi}\}$ is a phase deviation of the coil unit in the factory system to all input channels of the coil channel selector to the analog receiver via any output channel i.

In particular implementation, the ideal phase deviation $\theta_{mn}$ forming the ideal phase deviation matrix θ may be calculated by more than one method; as an example, one of these is shown below.

In this embodiment, the method of calculating the ideal phase deviation $\theta_{mn}$ in step 402 may be as follows:

step 4021: taking the row phase deviation $\{\theta'_{jn}\}$ and the column phase deviation $\{\theta'_{mi}\}$ of the actual phase deviation $\theta'_{mn}$ as a row reference value $\{\theta_{jn}\}$(0<j≤M) and a column reference value $\{\theta_{mi}\}$(0<i≤N) of the ideal phase deviation matrix θ respectively step 4022: the ideal phase deviation $\theta_{mn}$ may be acquired by formula (7) below:

$$\theta_{mn}=\theta_{mi}+\theta_{jn}-\theta_{ji} \quad (7)$$

wherein $\{\theta_{jn}\}=\{\theta'_{jn}\}$; $\{\theta_{mi}\}=\{\theta'_{mi}\}$;
$\{\theta_{jn}\}=\{\theta_{j1},\theta_{j2},\ldots,\theta_{jN}\}$, (n=1, 2 . . . N, 0<j<M);
$\{\theta_{mi}\}=\{\theta_{1i},\theta_{2i},\ldots,\theta_{Mi}\}$, (m=1, 2 . . . M, 0<i<N);
wherein $\theta_{jn}$ is a row element of the row reference value $\{\theta_{jn}\}$, $\theta_{mi}$ is a column element of the column reference value $\{\theta_{mi}\}$, $\theta_{ji}$ is a row/column intersection element; $\theta_{mi}$ represents an element value in the ith column and the mth row, $\theta_{jn}$ represents an element value in the nth column and the jth row, $\theta_{ji}$ represents an element value in the jth row and the ith column, M is the maximum value of the number of rows in the matrix, N is the maximum value of the number of columns in the matrix, 1≤m≤M, 1≤n≤N.

The method of acquiring the ideal phase deviation $\theta_{mn}$ in step 402 can, on the basis of historical factory data of the system, quickly calculate the ideal phase deviation $\theta_{mn}$, establishing a reference basis for the fast calibration method.

In the same way as the mathematical model of the actual phase deviation matrix θ' of the factory MR system, the ideal phase deviation matrix θ may be obtained by means of the ideal phase deviation $\theta_{mn}$; this may be as shown in formula (8) below:

$$\theta = \begin{bmatrix} \theta_{11} & \cdots & \theta_{1N} \\ \vdots & \ddots & \vdots \\ \theta_{M1} & \cdots & \theta_{MN} \end{bmatrix} \quad (8)$$

A phase deviation $\Delta\theta_{mn}$ in step 403 may be obtained on the basis of the ideal phase deviation $\theta_{mn}$ obtained in step 4022. The phase deviation $\Delta\theta_{mn}$ may be the difference between the actual phase deviation $\theta'_{mn}$ and the ideal phase deviation $\theta_{mn}$, as shown in formulae (9) and (10) below:

$$\Delta\theta_{mn}=\theta'_{mn}-\theta_{mn} \quad (9)$$

i.e. $\Delta\theta_{mn}=\theta'_{mn}-(\theta_{mi}+\theta_{jn}-\theta_{ij})$  (10)

A method for calculating the phase deviation matrix is established by means of formula (10), and by finding the difference between elements in corresponding positions of the actual phase deviation $\theta'_{mn}$ and the ideal phase deviation $\theta_{mn}$, the phase deviation $\Delta\theta_{mn}$ can be obtained quickly, to provide basic data for the fast calibration method.

In this embodiment, the row phase deviation $\{\theta'_{jn}\}$ in step 4021 is a first row phase deviation $\{\theta'_{1n}\}$ of the actual phase deviation matrix θ, i.e. said any input channel j204 is chosen to be a first input channel 204; the column phase deviation $\{\theta'_{mi}\}$ is a first column phase deviation $\{\theta'_{m1}\}$ of the actual phase deviation matrix θ, i.e. said any output channel i205 is chosen to be a first output channel 205.

The first row phase deviation $\{\theta'_{1n}\}$ and first column phase deviation $\{\theta'_{m1}\}$ are the row reference value $\{\theta_{1n}\}$ and column reference value $\{\theta_{m1}\}$ of the ideal phase deviation matrix θ respectively, and the ideal phase deviation $\theta_{mn}$ is:

$$\theta_{mn}=\theta_{m1}+\theta_{1n}-\theta_{11} \tag{11}$$

wherein $\{\theta_{1n}\}=\{\theta'_{1n}\}=\{\theta'_{11}, \theta'_{12}, \ldots, \theta'_{1N}\}=\{\varphi'_1+\omega'_1, \varphi'_1+\omega'_2, \ldots, \varphi'_1+\omega'_N\}$;
$\{\theta_{m1}\}=\{\theta'_{m1}\}=\{\theta'_{11}, \theta'_{21}, \ldots, \theta'_{M1}\}=\{\varphi'_1+\omega'_1, \varphi'_2+\omega'_1, \ldots, \varphi'_M+\omega'_1\}$;

$\theta'_{1n}$ is a row element of the row phase deviation $\{\theta'_{1n}\}$, $\theta'_{m1}$ is a column element of the column phase deviation $\{\theta'_{m1}\}$, $\theta_{1n}$ is a row element of the row reference value $\{\theta_{1n}\}$, $\theta_{m1}$ is a column element of the column reference value $\{\theta_{m1}\}$, and $\theta_{11}$ is a row/column intersection element;

$\{\theta_{1n}\}=\{\theta_{11}, \theta_{12}, \ldots, \theta_{1N}\}$, (n=1, 2 ... N, 0<j<M);
$\{\theta_{m1}\}=\{\theta_{11}, \theta_{21}, \ldots, \theta_{M1}\}$, (m=1, 2 ... M, 0<i<N);

wherein $\theta_{m1}$ represents an element value in the 1st column and the mth row, $\theta_{1n}$ represents an element value in the nth column and the 1st row, $\theta_{11}$ represents an element value in the 1st row and the 1st column, M is the maximum value of the number of rows in the matrix, N is the maximum value of the number of columns in the matrix, 1≤m≤M, 1≤n≤N.

As shown in FIG. 2, the first row phase deviation $\{\theta'_{1n}\}$ may be a phase deviation of a coil unit 201 in the MR system to an analog receiver 203 via the first input channel 204 of a coil channel selector 202 and via all N output channels 205; the first column phase deviation $\{\theta'_{m1}\}$ may be a phase deviation of all M input channels 204 in the MR system to the analog receiver 203 via the first output channel 205.

The method described above reduces the complexity of calculation of the ideal phase deviation matrix; the complete ideal phase deviation matrix is fitted by means of actual phase deviation values of the factory system in just one row and one column.

Step 403: calculating the phase deviation $\Delta\theta_{mn}$ of the actual phase deviation $\theta'_{mn}$ and the ideal phase deviation $\theta_{mn}$.

In particular implementation, the phase deviation $\Delta\theta_{mn}$ may be calculated by more than one method; as an example, one of these is shown below.

In this embodiment, the phase deviation $\Delta\theta_{mn}$ in step 403 is the difference between the actual phase deviation $\theta'_{mn}$ and the ideal phase deviation $\theta_{mn}$; this may be as shown in formulae (8) and (9) below:

$$\Delta\theta_{mn}=\theta'_{mn}-\theta_{mn} \tag{12}$$

i.e. $\Delta\theta_{mn}=\theta'_{mn}-(\theta_{m1}+\theta_{1n}-\theta_{11})$ (13)

Step 404: acquiring a maximum value $\Delta\theta_{max}$ of the phase deviation $\Delta\theta_{mn}$.

It is clear from the phase deviation $\Delta\theta_{mn}$ acquired in step 403 that there are M*N phase deviation values in total; the largest phase deviation value is chosen as $\Delta\theta_{max}$.

Step 405: determining whether the maximum value $\Delta\theta_{max}$ is less than a preset threshold δ. When the maximum value $\Delta\theta_{max}$ is less than the preset threshold δ, performing step 406.

In this embodiment, the setting of the preset threshold δ may have more than one standard according to actual circumstances; one of these is shown below as an example.

The standard of the preset threshold δ may be set as: when the maximum value $\Delta\theta_{max}$ of the phase deviation is less than the preset threshold, there is no obvious visible effect on image quality.

In other embodiments, in the case where the maximum value $\Delta\theta_{max}$ is not less than the preset threshold δ, operations other than step 406 may also be performed according to actual circumstances; no restrictions are imposed in this respect here.

Step 406: using a row phase deviation $\{\theta''_{jn}\}$ and a column phase deviation $\{\theta''_{mi}\}$ of a field system to calculate a field system phase deviation $\theta''_{mn}$; a field system phase deviation matrix θ″ formed by the field system phase deviation $\theta''_{mn}$ subjects the field system to phase calibration.

The row phase deviation $\{\theta''_{jn}\}$ is a phase deviation of a coil unit in the field system to any input channel j of a coil channel selector to an analog receiver via all output channels; the column phase deviation $\{\theta''_{mi}\}$ is a phase deviation of the coil unit in the field system to all input channels of the coil channel selector to the analog receiver via any output channel i, wherein m is a positive integer variable, and n is a positive integer variable.

In actual application, when the maximum value $\Delta\theta_{max}$ is not less than the preset threshold δ, methods for acquiring the actual phase deviation $\theta'_{mn}$ may be used to acquire the field system phase deviation $\theta''_{mn}$. The following method is one of these, i.e. measuring each element in the phase deviation $\theta''_{mn}$.

In this embodiment, a method of measuring the field system phase deviation $\theta''_{mn}$ is as follows:

measuring an input phase deviation $\theta''_m$ from a coil unit 201 via M input channels 204 of a coil channel selector 202 and an output phase deviation $\omega''_n$ of N output channels 205 to an analog receiver 203 in an MR system at a client site, as shown in formula (14) below:

$$\theta''_{mn}=\varphi''_m+\omega''_n \tag{14}$$

wherein $\theta''_{mn}$ is the field system phase deviation, $\varphi''_m$ is the input phase deviation, and $\omega''_n$ is the output phase deviation.

The field system phase deviation matrix θ″ formed by the field system phase deviation $\theta''_{mn}$ shown in formula (14) may be as shown in formula (15) below:

$$\theta'' = \begin{bmatrix} \theta''_{11} & \cdots & \theta''_{1N} \\ \vdots & \ddots & \vdots \\ \theta''_{M1} & \cdots & \theta''_{MN} \end{bmatrix} = \begin{bmatrix} \varphi''_1+\omega''_1 & \cdots & \varphi''_1+\omega''_N \\ \vdots & \ddots & \vdots \\ \varphi''_M+\omega''_1 & \cdots & \varphi''_M+\omega''_N \end{bmatrix} \tag{15}$$

wherein $\varphi''_M$ is the input phase deviation from the coil unit 201 via the Mth input channel 204 of the coil channel selector 202 in the field system; $\omega''_N$ is the output phase deviation from the Nth output channel 205 of the coil channel selector 202 to the analog receiver 203 in the MR system, m is a positive integer, n is a positive integer, M is the maximum value of the number of rows in the matrix, N is the maximum value of the number of columns in the matrix, 1≤m≤M, 1≤n≤N.

Still taking as an example the case where the simplified model of the measurement of phase deviation in an MR system shown in FIG. 2 is used, a method of measuring the field system phase deviation $\theta''_{mn}$ is explained.

The measurement of the field system phase deviation $\theta''_{mn}$ may be the measurement of the input phase deviation from the coil unit 201 to the input channel 204 of the coil channel selector 202 and the measurement of the output phase deviation from the output channel 205 of the coil channel selector 202 to the analog receiver 203; the sum of the input phase deviation and the output phase deviation is then the phase deviation $\theta''_{mn}$. It has been verified by experiment that a phase deviation of the coil channel selector 202 itself can be ignored.

In one embodiment, when the maximum value $\Delta\theta_{max}$ is less than the preset threshold δ, it is possible to use the following calculation of the field system phase deviation $\theta''_{mn}$, and the field system phase deviation matrix $\theta''$ formed by the field system phase deviation $\theta''_{mn}$, to subject the field system to phase calibration.

The specific implementation is as follows:

A row phase deviation $\{\theta''_{jn}\}$ and a column phase deviation $\{\theta''_{mi}\}$ of a field system are used to calculate a field system phase deviation $\theta''_{mn}$; a field system phase deviation matrix $\theta''$ formed by the field system phase deviation $\theta''_{mn}$ subjects the field system to phase calibration.

The row phase deviation $\{\theta''_{jn}\}$ is a phase deviation of a coil unit 201 in the field system to any input channel j204 of a coil channel selector 202 to an analog receiver via all output channels 205; the column phase deviation $\{\theta''_{mi}\}$ is a phase deviation of the coil unit 201 in the field system to all input channels 204 of the coil channel selector 202 to the analog receiver 203 via any output channel i205, wherein m is a positive integer variable, and n is a positive integer variable.

The field system phase deviation $\theta''_{mn}$ is obtained by the following formula:

$$\theta''_{mn} = \theta''_{mi} + \theta''_{jn} - \theta''_{ji} \quad (16)$$

wherein $\theta''_{mi}$ represents an element value in the ith column and the mth row, $\theta''_{jn}$ represents an element value in the nth column and the jth row, $\theta''_{ji}$ represents an element value in the jth row and the ith column, M is the maximum value of the number of rows in the matrix, N is the maximum value of the number of columns in the matrix, $1 \leq m \leq M$, $1 \leq n \leq N$.

The field system phase deviation matrix $\theta''$ formed by the field system phase deviation $\theta''_{mn}$ is:

$$\theta'' = \begin{bmatrix} \theta''_{11} & \cdots & \theta''_{1N} \\ \vdots & \ddots & \vdots \\ \theta''_{M1} & \cdots & \theta''_{MN} \end{bmatrix} \quad (17)$$

wherein M is the maximum value of the number of rows in the matrix, N is the maximum value of the number of columns in the matrix, $1 \leq m \leq M$, $1 \leq n \leq N$.

The row phase deviation $\{\theta''_{jn}\}$ and the column phase deviation $\{\theta''_{mi}\}$ may be selected from the first row phase deviation $\{\theta''_{1n}\}$ and the first column phase deviation $\{\theta''_{m1}\}$ respectively, and the complete field system phase deviation $\theta''_{mn}$ can be acquired by formula (18) below:

$$\theta''_{mn} = \theta''_{m1} + \theta''_{1n} - \theta''_{11} \quad (18)$$

The method of obtaining the field system phase deviation by formula (18) above employs the same method as that used to acquire the actual phase deviation of the factory system, i.e. in both cases, phase deviations in one row and one column are measured first, then phase deviations in other row and column positions are fitted; see formulae (8) to (11) for the theoretical basis of formula (18).

As shown in FIG. 2, an element value in the first row is an input phase deviation of a coil unit 201 in the MR system to an analog receiver 203 via the first input channel 204 of a coil channel selector 202 and via all N output channels 205; an element value in the first column is an output phase deviation of all M input channels 204 in the MR system to the analog receiver 203 via the first output channel 205.

In this embodiment, it is also possible fit the field system phase deviation $\theta_{mn}$% by column to acquire the field system phase deviation matrix $\theta''$; this can be obtained by the following method:

acquiring deviation of an nth column in the field system phase deviation $\theta''_{mn}$; this may be as shown in formula (19) below:

$$\begin{bmatrix} \theta''_{11} \\ \vdots \\ \theta''_{M1} \end{bmatrix} + \theta''_{1N} - \theta''_{11} \quad (19)$$

fitting n columns of deviation by column to form the field system phase deviation matrix $\theta''$; this may be as shown in formula (17).

The method of obtaining the field deviation matrix $\theta''$ by formula (19) reduces the complexity of calculation of the field system phase deviation matrix $\theta''$; the complete ideal phase deviation matrix is fitted by means of field phase deviation in just one row and one column. Moreover, the element values in the first row and the first column are easier to obtain, thereby reducing the workload of field measurement.

Besides acquiring the field system phase deviation matrix $\theta''$ by the method of fitting n columns of field system phase deviation $\theta''_{mn}$ as described above, the field system phase deviation matrix $\theta''$ may also be acquired by another method.

The calibration method for digital mode matrix phase in an embodiment of the present invention is a method for determining, on the basis of historical phase calibration data, whether a fast phase calibration method can be used, and can shorten the phase calibration time under the precondition that precision is ensured. In particular, when an engineer needs to reacquire phase deviation at a client site because hardware has been changed, the method reduces the workload of measurement and debugging at the client site, significantly increasing the calibration efficiency of the field system phase deviation.

A digital mode matrix phase calibration system of the present invention is also used for RF receiving link fault analysis.

Since the phase values of the MR system all satisfy the laws presented in formulae (5) to (19), the system may also be used for RF receiving link fault analysis. For example, in an actual system, an error might arise for various reasons, and if the disparity between the error and the ideal situation is too great, it is highly likely that a fault will occur. Thus, the present method may also be used for fault analysis, shortening the fault diagnosis time, and increasing the accuracy of the diagnosis result.

The digital mode matrix phase calibration method in embodiments of the present invention has been described in detail above; a digital mode matrix phase calibration system in embodiments of the present invention is described in detail below. With regard to details which are not disclosed in system embodiments of the present invention, the description in corresponding method embodiments may be referred to.

FIG. 5 is a demonstrative method structural diagram of a digital mode matrix phase calibration system in an embodiment of the present invention. As shown in FIG. 5, a digital mode matrix phase calibration system in an embodiment of the present invention may comprise: an actual phase deviation acquisition module 510, an ideal phase deviation calculation module 520, a phase deviation calculation module 530, a maximum value acquisition module 540, a determining module 550 and a field system phase deviation module 560.

The actual phase deviation acquisition module 510 is used for acquiring an actual phase deviation $\theta'_{mn}$ forming an actual phase deviation matrix $\theta'$ of a factory system.

In this embodiment, the actual phase deviation acquisition module 510 may comprise: a first measurement unit 311, a second measurement unit 312 and a summation unit 313.

The first measurement unit 311 is used for measuring an input phase deviation $\varphi'_m$ from a coil unit 201 via an input channel 204 of a coil channel selector 202 in an MR system; the second measurement unit 312 is used for measuring an output phase deviation $\omega'_n$ from an output channel 205 of the coil channel selector to an analog receiver 203 in the MR system; the summation unit 313 is used for calculating the sum of the input phase deviation $\varphi'_m$, and the output phase deviation $\omega'_n$.

In this embodiment, the actual phase deviation $\theta'_{mn}$ may be obtained by formula (5).

The method shown in formula (5) of splitting the actual phase deviation $\theta'_{mn}$ into the input phase deviation and the output phase deviation facilitates measurement of the actual phase deviation $\theta'_{mn}$ and fast calculation of an ideal phase deviation $\theta_{mn}$.

The ideal phase deviation calculation module 520 is used for calculating an ideal phase deviation $\theta_{mn}$ forming an ideal phase deviation matrix $\theta$.

In this embodiment, the calculation of the ideal phase deviation $\theta_{mn}$ by means of the ideal phase deviation calculation module 520 may be carried out by the following method:

taking a row phase deviation $\{\theta'_{jn}\}$ and a column phase deviation $\{\theta'_{mi}\}$ of the actual phase deviation $\theta'_{mn}$ as a row reference value $\{\theta_{jn}\}(0<j\leq M)$ and a column reference value $\{\theta_{mi}\}(0<i\leq N)$ of the ideal phase deviation matrix $\theta$ respectively, obtaining the ideal phase deviation $\theta_{mn}$ by formula (7), to obtain any element value $\theta_{mn}$ in the ideal phase deviation matrix $\theta$.

The ideal phase deviation $\theta_{mn}$ acquired in the manner of formula (7) above only needs element values in one row and one column in the actual phase deviation matrix $\theta'$; there are fewer reference element values, facilitating calculation.

The phase deviation calculation module 530 is used for calculating a phase deviation $\Delta\theta_{mn}$ of the actual phase deviation $\theta'_{mn}$ and the ideal phase deviation $\theta_{mn}$; this may be obtained by formula (9) and/or formula (10).

A method for calculating the phase deviation matrix is established by means of formula (9) and/or formula (10), and by finding the difference between elements in corresponding positions of the actual phase deviation $\theta'_{mn}$ and the ideal phase deviation $\theta_{mn}$, the phase deviation $\Delta\theta_{mn}$ can be obtained quickly, to provide basic data for the fast calibration method.

The maximum value acquisition module 540 is used for acquiring a maximum value $\Delta\theta_{max}$ of the phase deviation $\Delta\theta_{mn}$.

The determining module 550 is used for determining whether the maximum value $\Delta\theta_{max}$ is less than a preset threshold $\delta$.

The field system phase deviation module 560 is used for acquiring a field system phase deviation $\theta''_{mn}$ using the method by which an actual phase deviation module acquires the system actual phase deviation $\theta'_{mn}$ when the maximum value $\Delta\theta_{max}$ is greater than the preset threshold $\delta$; or is used for calculating the field system phase deviation $\theta''_{mn}$ using the field system phase deviation module when the maximum value $\Delta\theta_{max}$ is less than the preset threshold $\delta$, and a field system phase deviation matrix $\theta''$ formed by the field system phase deviation $\theta''_{mn}$ subjects the field system to phase calibration.

In this embodiment, when the maximum value $\Delta\theta_{max}$ is less than the preset threshold $\delta$, a row phase deviation $\{\theta''_{jn}\}$ and a column phase deviation $\{\theta''_{mi}\}$ of the field system are measured;

wherein the row phase deviation $\{\theta''_{jn}\}$ is a phase deviation of a coil unit 201 in the field system to any input channel j204 of a coil channel selector 202 to an analog receiver 203 via all output channels 205.

The column phase deviation $\{\theta''_{mi}\}$ is a phase deviation of the coil unit 201 in the field system to all input channels 204 of the coil channel selector 202 to the analog receiver 203 via any output channel i205. The field system phase deviation $\theta''_{mn}$ is obtained by formula (16).

The row phase deviation $\{\theta''_{jn}\}$ and the column phase deviation $\{\theta''_{mi}\}$ may be selected from a first row phase deviation $\{\theta''_{1n}\}$ and a first column phase deviation $\{\theta''_{m1}\}$ respectively, and the field system phase deviation $\theta''_{mn}$ is obtained by formula (18).

The use of phase deviations of the first row and the first column as reference values in this embodiment shortens the time taken to acquire the system phase deviation $\theta''_{mn}$, and the element value $\theta''_{1n}$ of the first row and the element value $\theta''_{m1}$ of the first column are easier to measure than element values in other rows or columns.

The field system phase deviation matrix $\theta''$ may be formed by the field system phase deviation $\theta''_{mn}$ by formula (17).

The fast calibration method for digital mode matrix phase in the present invention fits a complete phase deviation matrix by collecting phase deviation data of one row and one column of a field system, on the basis of factory phase calibration data and under the precondition that precision is ensured, i.e. that a preset threshold is satisfied; the method consumes little time, and has high accuracy.

A fast calibration method for digital mode matrix phase in an embodiment of the present invention is used for calibrating system phase in an MR system; since all MR systems satisfy the above laws, the present method may also be used for RF receiving link fault analysis.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A phase deviation acquisition method comprising:
acquiring a row phase deviation $\{\partial_{jn}\}$ of a coil unit in a magnetic resonance (MR) system to any input channel j of a coil channel selector to an analog receiver via all output channels;
acquiring a column phase deviation $\{\partial_{mi}\}$ of the coil unit to all input channels of the coil channel selector to the analog receiver via any output channel i; and
obtaining, by the row phase deviation $\{\partial_{jn}\}$ and column phase deviation $\{\partial_{mi}\}$, a phase deviation $\partial_{mn}$ of the coil unit in the MR system to any input channel m of the coil channel selector to the analog receiver via any output channel n, to obtain any element value $\partial_{mn}$ in the phase deviation matrix $\partial$, wherein i, j, m and n are each positive integers.

2. The method as claimed in claim 1, wherein obtaining, by the row phase deviation $\{\partial_{jn}\}$ and column phase deviation $\{\partial_{mi}\}$, a phase deviation $\partial_{mn}$ of the coil unit in the MR system to any input channel m of the coil channel selector to the analog receiver via any output channel n, comprises:

taking the row phase deviation $\{\partial_{jn}\}$ and column phase deviation $\{\partial_{mi}\}$ as a row reference value and a column reference value of a phase deviation matrix $\partial$ respectively, obtaining any element value $\partial_{mn}$ in the phase deviation matrix by $\partial$ means of the phase deviation $\partial_{mn}$ of the following formula:

$\partial_{mn} = \partial_{mi} + \partial_{jn} - \partial_{ji}$ wherein $\partial_{jn}$ is a row element of the row phase deviation $\{\partial_{jn}\}$, $\partial_{mi}$ is a column element of the column phase deviation $\{\partial_{mi}\}$, and $\partial_{ji}$ is a row/column intersection element;
$\{\partial_{jn}\} = \{\partial_{j1}, \partial_{j2}, \ldots, \partial_{jN}\}$, (n=1, 2 ... N, 0<j<M);
$\{\partial_{mi}\} = \{\partial_{1i}, \partial_{2i}, \ldots, \partial_{Mi}\}$, (m=1, 2 ... M, 0<i<N); and
m is a positive integer variable, n is a positive integer variable, M and N are the maximum numbers of rows and columns respectively in the phase deviation matrix $\partial$.

3. The method as claimed in claim 2, wherein the phase deviation matrix $\partial$ comprises:

$$\partial = \begin{bmatrix} \partial_{11} & \cdots & \partial_{1N} \\ \vdots & \ddots & \vdots \\ \partial_{M1} & \cdots & \partial_{MN} \end{bmatrix}.$$

4. The method as claimed in claim 2, comprising
acquiring the row element $\partial_{jn}$ by measuring an input phase deviation $\varphi_j$ from the coil unit via a jth input channel of the coil channel selector in the MR system and measuring an output phase deviation $\omega_n$ from an nth output channel of the coil channel selector to the analog receiver in the MR system, the sum of these two terms being the row phase deviation $\partial_{jn}$:

$\partial_{jn} = \varphi_j + \omega_n$; and acquiring the column element $\partial_{mi}$ by measuring an input phase deviation $\varphi_m$ from the coil unit via an mth input channel of the coil channel selector in the MR system and measuring an output phase deviation $\omega_i$ from an ith output channel of the coil channel selector to the analog receiver in the MR system, the sum of these two terms being the column phase deviation $\partial_{mi}$:

$\partial_{mi} = \varphi_m + \omega_i$.

5. The method as claimed in claim 2, wherein said any input channel j is a first input channel, said any output channel i is a first output channel, and
wherein $\{\partial_{m1}\} = \{\partial_{11}, \partial_{21}, \ldots, \partial_{M1}\}$, $\{\partial_{1n}\} = \{\partial_{11}, \partial_{12}, \ldots, \partial_{1N}\}$, and
the phase deviation $\partial_{mn}$ is $\partial_{mn} = \partial_{m1} + \partial_{1n} - \partial_{11}$.

6. The method as claimed in claim 1, further comprising performing RF receiving link fault analysis.

7. A phase deviation acquisition system, comprising:
a processor including a row phase deviation acquisition module, a column phase deviation acquisition module, and a calculation module;
said row phase deviation acquisition module, being configured to acquire a row phase deviation $\{\partial_{jn}\}$ of a coil unit in an MR system to any input channel j of a coil channel selector to an analog receiver via all output channels;
said column phase deviation acquisition module, being configured to acquire a column phase deviation $\{\partial_{mi}\}$ of the coil unit to all input channels of the coil channel selector to the analog receiver via any output channel i; and said calculation module being configured to use the row phase deviation $\{\partial_{jn}\}$ and column phase deviation $\{\partial_{mi}\}$ to calculate a phase deviation $\partial_{mn}$ of the coil unit in the MR system to any input channel m of the coil channel selector to the analog receiver via any output channel n, to acquire any element value $\partial_{mn}$ in the phase deviation matrix $\partial$ wherein i, j, m and n are each positive integers.

8. The system as claimed in claim 7, wherein the row phase deviation acquisition module and/or the column phase deviation acquisition module further comprise:
a first measurement unit configured to measure an input phase deviation from the coil unit via any input channel of the coil channel selector in the MR system;
a second measurement unit configured to measure an output phase deviation from any output channel of the coil channel selector to the analog receiver in the MR system; and
a summation unit configured to calculate the sum of the input phase deviation and the output phase deviation, to obtain the row phase deviation $\{\partial_{jn}\}$ and/or the column phase deviation $\{\partial_{mi}\}$.

9. A digital mode matrix phase calibration method, comprising:
acquiring an actual phase deviation $\theta'_{mn}$ forming an actual phase deviation matrix $\theta'$ of a factory system;
calculating an ideal phase deviation $\theta_{mn}$ forming an ideal phase deviation matrix $\theta$ by means of a row phase deviation $\{\theta_{jn}\}$ and a column phase deviation $\{\theta_{mi}\}$ of the actual phase deviation matrix $\theta'$;
calculating a phase deviation $\Delta\theta_{mn}$ of the actual phase deviation $\theta'_{mn}$ and the ideal phase deviation $\theta_{mn}$;
acquiring a maximum value $\Delta\theta_{max}$ of the phase deviation $\Delta\theta_{mn}$; and
when the maximum value $\Delta\theta_{max}$ is less than a preset threshold $\delta$, using a row phase deviation $\{\theta''_{jn}\}$ and a column phase deviation $\{\theta_{mi}\}$ of a field system to calculate a field system phase deviation $\theta''_{mn}$; and a field system phase deviation matrix $\theta''$ formed by the field system phase deviation $\theta''_{mn}$ subjecting the field system to phase calibration.

10. The calibration method as claimed in claim 9, further comprising:
when the maximum value $\Delta\theta_{max}$ is not less than the preset threshold $\delta$, acquiring the actual phase deviation $\theta'_{mn}$ to acquire the field system phase deviation $\theta''_{mn}$.

11. The calibration method as claimed in claim 9, wherein the actual phase deviation $\theta'_{mn}$ comprises:
an input phase deviation $\varphi'_m$ from the coil unit via an input channel of the coil channel selector and an output phase deviation $\omega'_n$ from an output channel of the coil channel selector to the analog receiver in the factory system are measured, and the input phase deviation $\varphi'_m$ and the output phase deviation $\omega'_n$ are added, to give the actual phase deviation $\theta'_{mn}$ of the factory system:

$\theta'_{mn} = \varphi'_m + \omega'_n$, wherein $\theta'_{mn}$ is the actual phase deviation of the factory system, $\varphi'_m$ is the input phase deviation, and $\omega'_n$ is the output phase deviation.

12. The calibration method as claimed in claim 11, wherein the actual phase deviation matrix $\theta'$ is:

$$\theta' = \begin{bmatrix} \varphi'_1 + \omega'_1 & \cdots & \varphi'_2 + \omega'_N \\ \vdots & \ddots & \vdots \\ \varphi'_M + \omega'_1 & \cdots & \varphi'_M + \omega'_N \end{bmatrix} = \begin{bmatrix} \theta'_{11} & \cdots & \theta'_{1N} \\ \vdots & \ddots & \vdots \\ \theta'_{M1} & \cdots & \theta'_{MN} \end{bmatrix}$$

wherein $\varphi'_M$ is the input phase deviation from the coil unit via an Mth input channel of the coil channel selector in an MR system; $\omega'_N$ is the output phase deviation from an Nth output channel of the coil channel selector to the analog receiver in the MR system, M is the maximum value of the number of rows in the matrix, and N is the maximum value of the number of columns in the matrix;

the row phase deviation $\{\theta'_{jn}\}$ and column phase deviation $\{\theta'_{mi}\}$ of the actual phase deviation matrix $\theta'$ are, respectively:

$\{\theta'_{jn}\}=\{\theta'_{j1},\theta'_{j2},\ldots\theta_{jN}\}=\{\varphi'_j+\omega'_1,\varphi'_j+\omega'_2,\ldots,\varphi'_j+\omega'_N\}$, and $\{\theta'_{mi}\}=\{\theta'_{1i},\theta'_{2i},\ldots,\theta_{Mi}\}=\{\varphi'_1+\omega'_i,\varphi'_2+\omega'_i,\ldots,\varphi'_M+\omega'_i\}$, wherein $\theta'_{jn}$ is a row element of the row phase deviation $\{\theta'_{jn}\}$, $\theta'_{mi}$ is a column element of the column phase deviation $\{\theta'_{mi}\}$.

13. The calibration method as claimed in claim 12, wherein the ideal phase deviation $\theta_{mn}$ comprises:

taking the row phase deviation $\{\theta'_{jn}\}$ and the column phase deviation $\{\theta'_{mi}\}$ of the actual phase deviation $\theta'_{mn}$ as a row reference value $\{\theta_{jn}\}(0<j\le M)$ and a column reference value $\{\theta_{mi}\}(0<i\le N)$ of the ideal phase deviation matrix $\theta$ respectively, the ideal phase deviation $\theta_{mn}$ is obtained by the following formula, to obtain any element value $\theta_{mn}$ in the ideal phase deviation matrix $\theta$:

$\theta_{mn}=\theta_{mi}+\theta_{jn}-\theta_{ji}$, wherein $\{\theta_{jn}\}=\{\theta'_{jn}\}$; $\{\theta_{mi}\}=\{\theta'_{mi}\}$;
$\{\theta_{jn}\}=\{\theta_{j1},\theta_{j2},\ldots,\theta_{jN}\}$, $(n=1, 2 \ldots N, 0<j<M)$,
$\{\theta_{mi}\}=\{\theta_{1i},\theta_{2i},\ldots,\theta_{Mi}\}$, $(m=1, 2 \ldots M, 0<i<N)$, wherein $\theta_{jn}$ is a row element of the row reference value $\{\theta_{jn}\}$, $\theta_{mi}$ is a column element of the column reference value $\{\theta_{mi}\}$, $\theta_{ji}$ is a row/column intersection element; $\theta_{mi}$ represents an element value in the ith column and the mth row, $\theta_{jn}$ represents an element value in the nth column and the jth row, $\theta_{ji}$ represents an element value in the jth row and the ith column, M is the maximum value of the number of rows in +the matrix, N is the maximum value of the number of columns in the matrix, $1\le m\le M$, $1\le n\le N$.

14. The calibration method as claimed in claim 13, wherein:

the row phase deviation $\{\theta'_{jn}\}$ is a first row phase deviation $\{\theta'_{1n}\}$ of the actual phase deviation matrix $\theta$, and said any input channel j is a first input channel; the column phase deviation $\{\theta'_{mi}\}$ is a first column phase deviation $\{\theta'_{m1}\}$ of the actual phase deviation matrix $\theta$, and said any output channel i is a first output channel; and the first row phase deviation $\{\theta'_{1n}\}$ and first column phase deviation $\{\theta'_{m1}\}$ are the row reference value $\{\theta_{1n}\}$ and column reference value $\{\theta_{m1}\}$ of the ideal phase deviation matrix $\theta$ respectively, and the ideal phase deviation $\theta_{mn}$ is:

$\theta_{mn}=\theta_{m1}+\theta_{1n}-\theta_{11}$.

15. The calibration method as claimed in claim 9, wherein the phase deviation $\Delta\theta_{mn}$ comprises:

$\Delta\theta_{mn}=\theta'_{mn}-(\theta_{m1}+\theta_{1n}-\theta_{11})$.

16. The calibration method as claimed in claim 9, wherein, when the maximum value $\Delta\theta_{max}$ is less than the preset threshold $\delta$, the calculation of the field system phase deviation $\theta''_{mn}$ comprises:

measuring a row phase deviation $\{\theta''_{jn}\}$ and a column phase deviation $\{\theta''_{mi}\}$ of the field system; and obtaining the field system phase deviation $\theta''_{mn}$ by the following formula:

$\theta''_{mn}=\theta''_{mi}+\theta''_{jn}-\theta''_{ji}$ the row phase deviation $\{\theta''_{jn}\}$ is a phase deviation of a coil unit in the field system to any input channel j of a coil channel selector to an analog receiver via all output channels; the column phase deviation $\{\theta''_{mi}\}$ is a phase deviation of the coil unit in the field system to all input channels of the coil channel selector to the analog receiver via any output channel i;

wherein $\theta''_{mi}$ represents an element value in the ith column and the mth row, $\theta''_{jn}$ represents an element value in the nth column and the jth row, $\theta''_{ji}$ represents an element value in the jth row and the ith column, M is the maximum value of the number of rows in the matrix, N is the maximum value of the number of columns in the matrix, $1\le m\le M$, $1\le n\le N$.

17. The calibration method as claimed in claim 16, wherein the field system phase deviation matrix $\theta''$ formed by the field system phase deviation $\theta''_{mn}$ comprises:

$$\theta'' = \begin{bmatrix} \theta''_{11} & \cdots & \theta''_{1N} \\ \vdots & \ddots & \vdots \\ \theta''_{M1} & \cdots & \theta''_{MN} \end{bmatrix}$$

wherein M is the maximum value of the number of rows in the matrix, and N is the maximum value of the number of columns in the matrix, $1\le m\le M$, $1\le n\le N$.

18. The calibration method as claimed in claim 10, wherein acquiring the actual phase deviation $\theta'_{mn}$ to acquire the field system phase deviation $\theta''_{mn}$ comprises:

measuring an input phase deviation $\varphi''_m$ from a coil unit via an input channel of a coil channel selector and an output phase deviation $\omega''_n$ from an output channel of the coil channel selector to an analog receiver in the field system, with:

$\theta''_{mn}=\varphi''_m+\omega''_n$ wherein $\theta''_{mn}$ is the actual phase deviation of the field system, $\varphi''_m$ is the input phase deviation, and $\omega''_n$ is the output phase deviation.

19. The calibration method as claimed in claim 18, wherein the field system phase deviation matrix $\theta''$ comprises:

$$\theta'' = \begin{bmatrix} \varphi''_1+\omega''_1 & \cdots & \varphi''_2+\omega''_N \\ \vdots & \ddots & \vdots \\ \varphi''_M+\omega''_1 & \cdots & \varphi''_M+\omega''_N \end{bmatrix} = \begin{bmatrix} \theta''_{11} & \cdots & \theta''_{1N} \\ \vdots & \ddots & \vdots \\ \theta''_{M1} & \cdots & \theta''_{MN} \end{bmatrix}$$

wherein $\varphi''_M$ is the input phase deviation from the coil unit via an Mth input channel of the coil channel selector in the field system; $\omega''_N$ is the output phase deviation from an Nth output channel of the coil channel selector to the analog receiver in the MR system, M is the maximum value of the number of rows in the matrix, and N is the maximum value of the number of columns in the matrix.

20. A digital mode matrix phase calibration system, comprising:

a processor including an actual phase deviation acquisition module, an ideal phase deviation calculation module, a maximum value acquisition module, a determining module, and a field system phase deviation module;
said actual phase deviation acquisition module configured to acquire an actual phase deviation $\theta'_{mn}$ of a factory system forming an actual phase deviation matrix $\theta'$;
said ideal phase deviation calculation module configured to calculate an ideal phase deviation $\theta_{mn}$ forming an ideal phase deviation matrix $\theta$;
said phase deviation calculation module, configured to calculate a phase deviation $\Delta\theta_{mn}$ of the actual phase deviation $\theta'_{mn}$ and the ideal phase deviation $\theta_{mn}$:

$$\Delta\theta_{mn}=\theta'_{mn}-\theta_{mn};$$

said maximum value acquisition module configured to acquire a maximum value $\Delta\theta_{max}$ of the phase deviation $\Delta\theta_{mn}$;
a determining module, configured to determine whether the maximum value $\Delta\theta_{max}$ is less than a preset threshold $\delta$; and
a field system phase deviation module configured to calculate the field system phase deviation $\theta''_{mn}$ using the field system phase deviation module when the maximum value $\Delta\theta_{max}$ is less than the preset threshold $\delta$, with a field system phase deviation matrix $\theta''$ formed by the field system phase deviation $\theta''_{mn}$ subjecting a field system to phase calibration, wherein m and n are each positive integer variables.

21. The calibration system as claimed in claim 20, wherein the actual phase deviation acquisition module comprises:
a first measurement unit configured to measure an input phase deviation $\varphi'_m$ from a coil unit via any input channel of a coil channel selector in the factory system;
a second measurement unit configured to measure an output phase deviation $\omega'_n$ from any output channel of the coil channel selector to an analog receiver in the factory system; and
a summation unit configured to calculate the actual phase deviation $\theta'_{mn}$, i.e. the sum of the input phase deviation $\varphi'_m$ and the output phase deviation $\omega'_n$:

$$\theta'_{mn}=\varphi'_m+\omega'_n.$$

22. The calibration system as claimed in claim 20, wherein the actual phase deviation matrix $\theta'$ formed by the actual phase deviation $\theta'_{mn}$ comprises:

$$\theta' = \begin{bmatrix} \varphi'_1+\omega'_1 & \cdots & \varphi'_2+\omega'_N \\ \vdots & \ddots & \vdots \\ \varphi'_M+\omega'_1 & \cdots & \varphi'_M+\omega'_N \end{bmatrix} = \begin{bmatrix} \theta'_{11} & \cdots & \theta'_{1N} \\ \vdots & \ddots & \vdots \\ \theta'_{M1} & \cdots & \theta'_{MN} \end{bmatrix}$$

wherein $\varphi'_M$ is the input phase deviation from the coil unit via an Mth input channel of the coil channel selector in an MR system; $\omega'_N$ is the output phase deviation from an Nth output channel of the coil channel selector to the analog receiver in the MR system, M is the maximum value of the number of rows in the matrix, and N is the maximum value of the number of columns in the matrix;
the row phase deviation $\{\theta'_{jn}\}$ and column phase deviation $\{\theta'_{mi}\}$ of the actual phase deviation matrix $\theta'$ are, respectively:

$$\{\theta'_{jn}\}=\{\theta'_{j1},\theta'_{j2},\ldots,\theta'_{jN}\}=\{\varphi'_j+\omega'_1,\varphi'_j+\omega'_2,\ldots,\varphi'_j+\omega'_N\};$$

$$\{\theta'_{mi}\}=\{\theta'_{1i},\theta'_{2i},\ldots,\theta'_{Mi}\}=\{\varphi'_1,\omega'_i,\varphi'_2+\omega'_i,\ldots,\varphi'_M+\omega'_i\}$$

$\theta'_{jn}$ is a row element of the row phase deviation $\{\theta'_{jn}\}$, $\theta'_{mi}$ is a column element of the column phase deviation $\{\theta'_{mi}\}$.

23. The calibration system as claimed in claim 22, wherein the ideal phase deviation calculation module is further configured to:
obtain the ideal phase deviation $\theta_{mn}$ by the following formula, taking the row phase deviation $\{\theta'_{jn}\}$ and the column phase deviation $\{\theta'_{mi}\}$ of the actual phase deviation $\theta'_{mn}$ as a row reference value $\{\theta_{jn}\}(0<j\leq M)$ and a column reference value $\{\theta_{mi}\}(0<i\leq N)$ of the ideal phase deviation matrix $\theta$ respectively, to obtain any element value $\theta_{mn}$ in the ideal phase deviation matrix $\theta$:

$$\theta_{mn}=\theta_{mi}+\theta_{jn}-\theta_{ji}$$

wherein $\{\theta_{jn}\}=\{\theta'_{jn}\}$; $\{\theta_{mi}\}=\{\theta'_{mi}\}$;
$\{\theta_{jn}\}=\{\theta_{j1},\theta_{j2},\ldots,\theta_{jN}\}$, (n=1, 2 ... N, 0<j<M);
$\{\theta_{mi}\}=\{\theta_{1i},\theta_{2i},\ldots,\theta_{Mi}\}$, (m=1, 2 ... M, 0<i<N);
wherein $\theta_{jn}$ is a row element of the row reference value $\{\theta_{jn}\}$, $\theta_{mi}$ is a column element of the column reference value $\{\theta_{mi}\}$, and $\theta_{ji}$ is a row/column intersection element; M is the maximum value of the number of rows in the matrix, N is the maximum value of the number of columns in the matrix, $1\leq m\leq M$, $1\leq n\leq N$.

24. The calibration system as claimed in claim 20, wherein the field system phase deviation calculation module is configured to:
measure a row phase deviation $\{\theta''_{jn}\}$ and a column phase deviation $\{\theta''_{mi}\}$ of the field system when the determining module determines that the maximum value $\Delta\theta_{max}$ is less than the preset threshold $\delta$;
wherein the row phase deviation $\{\theta''_{jn}\}$ is a phase deviation of a coil unit in the field system to any input channel j of a coil channel selector to an analog receiver via all output channels;
the column phase deviation $\{\theta''_{mi}\}$ is a phase deviation of the coil unit in the field system to all input channels of the coil channel selector to the analog receiver via any output channel i;
obtain the field system phase deviation $\theta_{mn}$ by the following formula:

$$\theta''_{mn}=\theta''_{mi}+\theta''_{jn}-\theta''_{ji}$$

wherein the row phase deviation $\{\theta''_{jn}\}$ is a phase deviation of a coil unit in the field system to any input channel j of a coil channel selector to an analog receiver via all output channels; the column phase deviation $\{\theta''_{mi}\}$ is a phase deviation of the coil unit in the field system to all input channels of the coil channel selector to the analog receiver via any output channel i; $\theta''_{mi}$ represents an element value in the ith column and the mth row, $\theta''_{jn}$ represents an element value in the nth column and the jth row, $\theta''_{ji}$ represents an element value in the jth row and the ith column, M is the maximum value of the number of rows in the matrix, N is the maximum value of the number of columns in the matrix, $1\leq m\leq M$, $1\leq n\leq N$.

25. The calibration system as claimed in claim 21, wherein the field system phase deviation module is further configured to acquire the field system phase deviation $\theta''_{mn}$ by using the actual phase deviation module acquiring the actual phase deviation $\theta'_{mn}$ when the maximum value $\Delta\theta_{max}$ is greater than the preset threshold $\delta$.

* * * * *